(12) United States Patent
Motoki et al.

(10) Patent No.: US 6,468,347 B1
(45) Date of Patent: Oct. 22, 2002

(54) METHOD OF GROWING SINGLE CRYSTAL GAN, METHOD OF MAKING SINGLE CRYSTAL GAN SUBSTRATE AND SINGLE CRYSTAL GAN SUBSTRATE

(75) Inventors: Kensaku Motoki; Takuji Okahisa; Naoki Matsumoto, all of Itami (JP)

(73) Assignee: Sumitomo Electric Industries Ltd., Osaka (JP)

( * ) Notice: Subject to any disclaimer, the term of this patent is extended or adjusted under 35 U.S.C. 154(b) by 34 days.

(21) Appl. No.: 09/669,840

(22) Filed: Sep. 27, 2000

(30) Foreign Application Priority Data

Sep. 28, 1999 (JP) ............................................ 11-273882

(51) Int. Cl.⁷ .............................................. C30B 25/04
(52) U.S. Cl. .............................. 117/89; 117/95; 117/97; 117/106; 117/952; 117/953
(58) Field of Search .............................. 117/89, 97, 95, 117/106, 952, 923

(56) References Cited

U.S. PATENT DOCUMENTS

| 5,650,198 A | 7/1997 | Denbaars et al. | 427/255.2 |
| 5,928,421 A | 7/1999 | Masaaki et al. | 117/97 |
| 6,091,085 A * | 7/2000 | Lester | 257/98 |
| 6,252,261 B1 * | 6/2001 | Usui et al. | 257/190 |
| 6,254,675 B1 * | 7/2001 | Aldinger et al. | 117/89 |
| 6,325,850 B1 * | 12/2001 | Beaumont et al. | 117/95 |

FOREIGN PATENT DOCUMENTS

| EP | 0 942 459 | 9/1999 |
| EP | 0 966 047 | 12/1999 |
| JP | 10312971 | 11/1998 |
| WO | WO 98 45511 | 10/1998 |

OTHER PUBLICATIONS

Usui A., "Growth of Thick Gan Layers By Hyride Vapor-Phase Epitaxy", Electronic & Communications in Japan, Part II—Electronics, US, Scripta Technica, vol. 81, No. 7, Jul. 1998, pp. 57–63.

Weyher J. L. et al., "Chemical Polishing of Bulk and Epitaxial GaN", Journal of Crystal Growth, NL, North–Holland Publishing Co. Amsterdam, vol. 182, No. 1–2, Dec. 1, 1997, pp. 17–22.

Patent Abstracts of Japan, vol. 1999, No. 2, Feb. 26, 1999 and JP 10312971, Nov. 24, 1998.

Yu Z. et al., "Study of the Epitaxial–Lateral–Overgrowth Process for Gan on Sapphire", Journal of Crystal Growth, NL, North–Holland Publishing Co., Amsterdam, vol. 195, No. 1/04, Dec. 1998, pp 333–339.

Thick Layer Growth fo GaN by Hydride Vapor Phase Epitaxy Akira USSUI; C–11, vol. J81–C–II; No. 1, pp. 58–64; 1998 (with translation).

J.J. Appl. Phys. vol. 68, No. 7, GaN; Fundamental Research Laboratories; pp. 774–779; 1999 ( with translation).

Published International Application; PCT Gazette; page 1.

* cited by examiner

Primary Examiner—Robert Kunemund
(74) Attorney, Agent, or Firm—Smith, Gambrell & Russell, LLP

(57) ABSTRACT

A GaN single crystal is grown by synthesizing GaN in vapor phase, piling a GaN crystal on a substrate, producing a three-dimensional facet structure including facets in the GaN crystal without making a flat surface, maintaining the facet structure without burying the facet structure, and reducing dislocations in the growing GaN crystal. The facet structure reduces the EPD down to less than $10^6$ cm$^{-2}$.

51 Claims, 10 Drawing Sheets

D: multidefect point hysteresis of pits
case A : maintaining constant facet regions hysteresis of pits
case B : changing the facet regions hysteresis of pits
case C : changin the facet regions dislocation density C < B < A Fig. 14  lateral overgrowth
first step
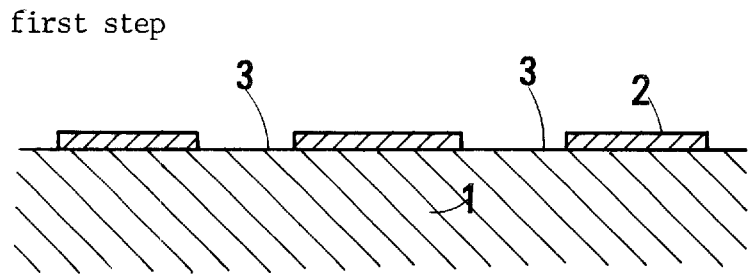
Fig. 15
second step
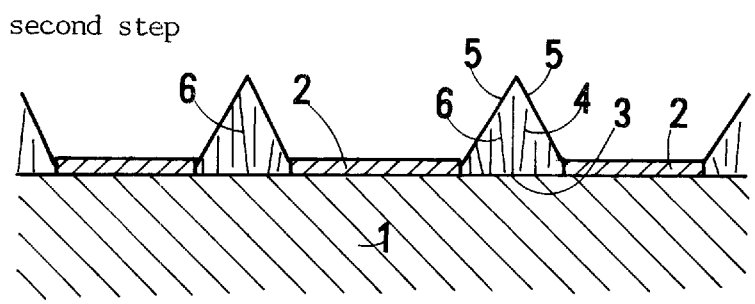
Fig. 16
third step
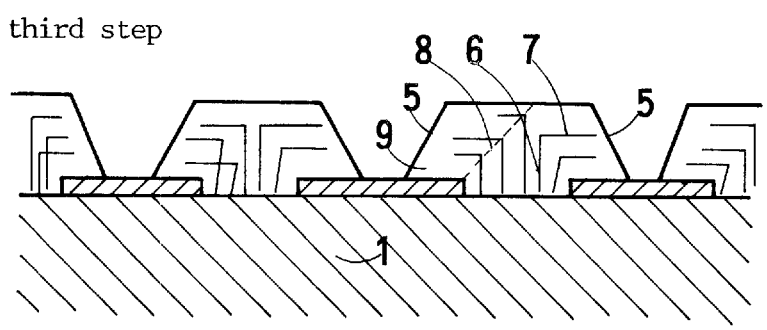
Fig. 17
fourth step
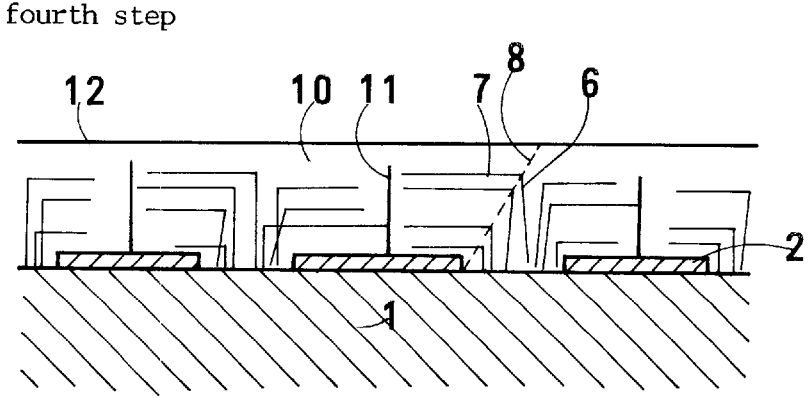

manufacturing process of GaN substrate
Embodiment 1 manufacturing process of GaN substrate
Embodiment 2 manufacturing process of GaN substrate
Embodiment 3 and 4

Fig.21 (a) manufacturing process of GaN substrate Embodimet 5
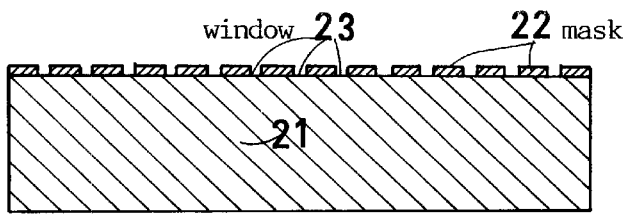
Fig.21 (b)
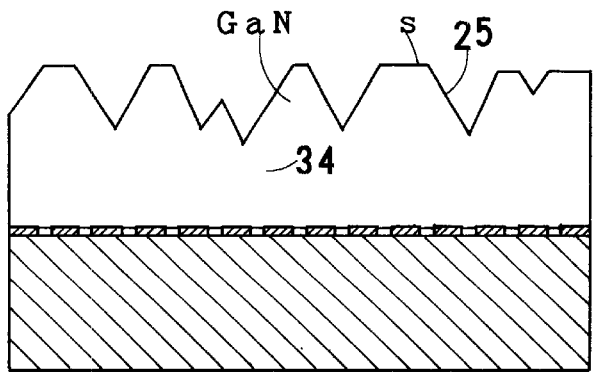
Fig.21 (c)
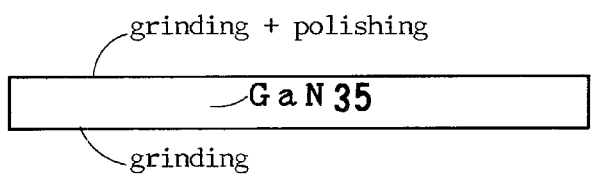
Fig.21 (d)
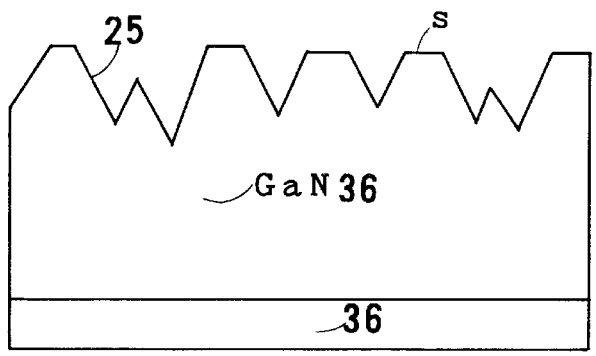
Fig.21 (e)
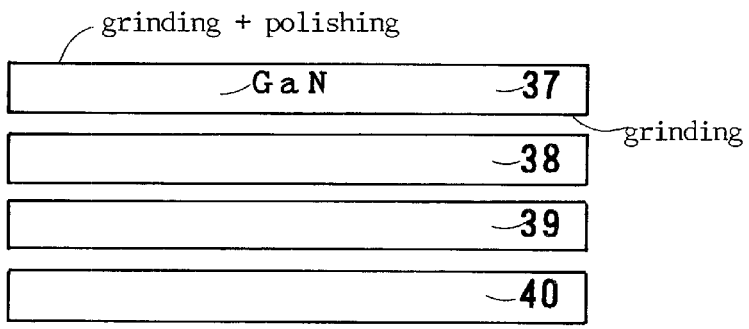

METHOD OF GROWING SINGLE CRYSTAL GAN, METHOD OF MAKING SINGLE CRYSTAL GAN SUBSTRATE AND SINGLE CRYSTAL GAN SUBSTRATE

BACKGROUND OF THE INVENTION

1. Field of the Invention

This invention relates to a GaN single crystal substrate, a method of growing a GaN single crystal and a method of making a GaN single crystal substrate which is used for producing light emitting devices, for example, light emitting diodes (LEDs) and laser diodes (LDs).

This application claims the priority of Japanese Patent Application No.11-273882 (273882/1999) filed Sep. 28, 1999 which is incorporated herein by reference.

2. Description of Related Art

Light emitting devices based upon group III-V nitride semiconductors (GaN, GaInN) have been put into practice, in the field of blue light LEDs (light emitting diodes). Since wide gallium nitride (GaN) substrates cannot be produced, the nitride semiconductor devices (blue light LEDs) have been produced upon sapphire substrates ($Al_2O_3$). Sapphire crystal ($Al_2O_3$) belongs to hexagonal symmetry group. The c-plane (0001) has six-folding rotation symmetry. Thin films of GaN or GaInN are heteroepitaxially grown upon the sapphire substrates for making GaInN type blue light LEDs. The GaN films or GaInN films grown on the sapphire substrates are suffering from a large number of dislocations of about $10^9$ $cm^{-2}$. Despite the high dislocation density, the GaInN/sapphire LEDs made by piling GaN films and GaInN films on the sapphire substrates exhibit high blue light power and a long lifetime as blue light LEDs. The high density of dislocations in the GaN or GaInN films is not a hindrance to the GaInN/sapphire LEDs. Sapphire is sturdy and strong chemically and physically and refractory (high heat-resistance). The sapphire substrate is a very hard and stable material. The advantages allow sapphire to exclusively serve substrates to the GaInN-type blue light LEDs.

The sapphire substrates have still drawbacks. The sapphire substrate has no cleavage plane which would enable device makers to cut a processed wafer into individual chips in exact orientations along the natural cleavage planes without difficulty. Unlike traditional semiconductor wafers, the lack of cleavage forces the device makers to dice the sapphire wafer lengthwise and crosswise with a dicing machine. The dicing step raises the cost of production for making LEDs. In the case of making laser diodes in future, the lack of cleavage will prohibit the makers from forming a pair of mirrors as a resonator by natural cleavage. The resonators made by polishing incur problems in quality and raise the cost of manufacturing. A further drawback is the fact that the sapphire substrate is an insulator.

The insulating substrate invites various problems on electrode fabrication. Unlike a conventional conductive substrate, the bottom of the sapphire substrate cannot be an electrode. In stead of the bottom, a part of a middle layer is exposed by polishing partially the top of a GaN chip for serving a room for an n-electrode. Connection between the LED electrodes and leads requires wirebonding two times per chip. The electric current flows in the horizontal direction in the intermediate GaN layer having the lower electrode. The GaN intermediate layer should be allocated with a sufficient large thickness for decreasing electric resistance. Two electrodes made on the top require a wide area for the LED chip. The GaN devices on the sapphire substrates are suffering from high cost.

Silicon carbide (SiC) substrates have been proposed for the GaN devices for solving the problems accompanying the sapphire substrates. SiC has natural cleavage planes which allow device makers to cut a SiC wafer along the natural cleavage lines in exact orientations without difficulty. The SiC substrate would solve the problems of the dicing step and the resonators of LDs. SiC has good electric conduction which allows a substrate bottom to become a lower electrode. The bottom electrode can reduce the space occupied by the electrodes. A single wirebonding connects the top electrode to the lead. In spite of the convenient properties, SiC is far more expensive than sapphire. SiC is difficult to obtain due to poor supply of SiC. Poor supply of SiC would invite high cost and instability in quality. Further, a GaN film grown upon the SiC substrate still has a problem in quality which is not solved at present. The high cost still inhibits the SiC substrate from bringing GaInN/SiC blue light LEDs into practice.

Crystallographical problems should be pointed out. Heteroepitaxial growth of GaN single crystal films upon sapphire substrates or silicon carbide substrates introduces many defects, e.g., dislocations into the film crystals due to the misfit of lattice structures between the films and the substrates. Different lattice constants degrade the property of the grown crystals. Indeed, it is said that the epitaxial layers of GaN or GaInN upon sapphire substrates on sale should include very high density of dislocations of about $10^9$ $cm^{-2}$.

In the case of the silicon carbide substrates, they say that the GaN or GaInN layers should contain high dislocation density of about $10^8$ $cm^{-2}$.

Such high density of dislocation would fully deprive Si or GaAs devices of all the desired functions in the case of the Si or GaAs semiconductor devices. Defects are fatal for Si or GaAs crystals. Device fabrication on state of art requires dislocation-free crystals for Si and low dislocation density crystals for GaAs. Low dislocation density or non-dislocation density is indispensable for the preceding Si devices or GaAs devices.

To our surprise, GaN(GaInN) blue light LEDs function quite well despite of such high dislocation density. Many dislocations do not impede the device makers from bringing the GaN type LEDs into practice. Plenty of dislocations do not invite degradation of the LEDs. The GaInN type blue light LEDs are not annoyed at the high dislocation density at present.

The high dislocation density of the crystals induces few problems on the GaN LEDs, because the current density is small in the LEDs. However, such high density of dislocations will induce difficulties in the case of LDs (laser diodes) which require far larger current density than LEDs. The high current density facilitates the degradation originating from the defects in a short time. Current GaInN blue light LDs made upon sapphire substrates are still suffering from a short lifetime. The GaInN blue light LDs have not attained to the practical level yet due to the rapid degradation and the short lifetime in contradiction to the GaInN LEDs. $10^9$ $cm^{-2}$ dislocations seem to reduce the lifetime of the GaInN LDs. The sapphire substrates originate plenty of dislocations in the GaN and GaInN layers grown on the substrates.

The Inventors of the present invention think that the best substrate for the GaN devices should be a GaN single crystal substrate. The adoption of GaN single crystals as the substrates should entirely solve the problem of the mismatching of the lattice constant. The GaN single crystal has cleavage unlike sapphire. Natural cleavage will facilitate to cut a processed wafer into individual device chips. Natural cleavage will replace the dicing step. The cleavage planes will be assigned as the mirrors of resonators in the case of making GaInN laser diodes (LDs). Unlike sapphire, GaN crystal has electric conductivity which simplifies the structure of electrodes by allowing the crystal to assign an n-electrode on the bottom. GaN single crystal is the best candidate for the substrate for growing the GaN or GaInP layers. However, the GaN single crystal has not been used as the substrate for the GaN-type LEDs or LDs. Why has GaN not been adopted yet? The reason is that large GaN single crystals have never been made. The difficulty of making the GaN single crystal forces the adoption of sapphire for the substrate of the GaN devices.

When solid GaN material is heated, the GaN is directly sublimed instead of giving a GaN melt. It is impossible to make a GaN melt which would allow the ordinary Czochralski method. It is said that ultrahigh pressure would be able to make an equilibrium state between the liquid phase and the solid phase of GaN. It is difficult to produce a GaN single crystal of a practical size in the ultrahigh pressure growing apparatus. Even if a single crystal of GaN were made, the crystal would be very small. Such a small GaN crystal is inappropriate for the substrates of making LEDs or LDs. A large sized ultrahigh pressure growing apparatus is necessary to making a large sized GaN single crystal in the equilibrium state, which prevents producing GaN single crystals on an industrial scale.

The Inventors have contrived a new method of growing a GaN crystal via a mask having windows on a GaAs (gallium arsenide) substrate in vapor phase for reducing the dislocations. This method is called a "lateral overgrowth method" or a "lateral growth method".

① Japanese Patent Application No.9-298300 (298300/'97) and

② Japanese Patent Application No.10-9008 (9008/'98) proposed the lateral overgrowth method by the Inventors. The lateral overgrowth method makes a GaN crystal by forming a mask with dot windows or stripe windows on a GaAs substrate and growing a GaN crystal through the windows on the GaAs substrate. The method aims at producing a single crystal GaN wafer.

③ Japanese Patent Application No.10-102546 (102546/'98) proposed an improved method of making a plurality of GaN wafers by employing the GaN single crystal wafer produced by ① or ② as a seed, growing a thick GaN crystal ingot upon the GaN seed and slicing the ingot into a plurality of thin GaN wafers. The new method enables the Inventors to produce GaN substrates on an industrial scale.

GaN has cleavage which will solve the difficulty of dicing a processed wafer into individual chips. An n-type GaN substrate enables device makers to make LED film structures on the n-GaN substrate and forming n-electrodes on the bottom surface of the GaN substrate. The electrode design requires a smaller chip area than the sapphire substrate which allocates two electrodes upon the chip horizontally. The vertical electrode allotment saves one bonding wire per chip. The GaN substrates are profitable for making LEDs. In the case of making LDs, the resonator will be made by the natural cleavage. The GaN crystals cannot be a substrate for producing laser diodes (LDs) yet for some reasons.

The search for making blue light or violet light laser diodes has been clarifying the fact that the largest problem is to reduce the defect density in the GaN substrate. The defects, e.g., dislocations turn out to have a strong influence upon the lifetime or the properties of LDs because the LD is used under a severe condition of high current density. Prolongation of the lifetime of LDs, in particular, requires reducing the defect density in the GaN substrate.

Even the newly contrived lateral overgrowth method cannot decrease the defect density to a low level of less than $1 \times 10^7$ cm$^{-2}$ yet. Blue light LDs can be made upon the GaN substrate of the defect density of about $1 \times 10^7$ cm$^{-2}$. The lifetime is so short that the LDs cannot be used for practical use. Long lifetime GaN LDs require reducing further the defect density to a low level of less than $1 \times 10^6$ cm$^{-2}$. Namely, the dislocation (EPD; etch pit density) should be further reduced to the low level of less than $1 \times 10^2$ cm$^{-2}$. Here, the long lifetime of the LDs means a time longer than 10000 hours.

A first purpose of the present invention is to provide a low dislocation density GaN crystal of less than $1 \times 10^6$ cm$^{-2}$. A second purpose of the present invention is to provide a method for growing a low dislocation density GaN crystal of less than $1 \times 10^6$ cm$^{-2}$.

SUMMARY OF THE INVENTION

The Inventors have investigated the methods proposed for growing a GaN crystal in vapor phase for giving an effective solution to the above mentioned problems. The lateral overgrowth method which is the object for the investigation is explained by ④ EIC, vol.J81-C-II, No.1, p58–64(January 1998), and ⑤ Akira Sakai, Akira Usui, "Reduction of dislocation density in GaN films by epitaxial lateral over growth", J.J.Appl. Phys., vol.68, No.7, p774–779(1999). FIG. 14 to FIG. 17 show the steps of the lateral overgrowth.

FIG. 14 shows the section of a sapphire substrates, a GaN thin film piled on the substrate (which can be omitted), and a mask 2 with stripes 3 extending in the [11$\bar{2}$0] direction on the thin GaN film. The masked sapphire substrate is introduced into a furnace for growing a GaN layer on the substrate 1. As shown in FIG. 15, the GaN growth is selectively initiated on the exposed parts of the sapphire within the windows 3. The GaN film does not pile on the mask 2. (11$\bar{2}$2) planes, ($\bar{1}$e$\bar{1}$22) planes dominantly grow within the windows 3. Triangle-sectioned ridges 4 are formed along the stripe windows 3 having the (11$\bar{2}$2) planes and the ($\bar{1}\bar{1}$22) planes. The GaN film takes over the dislocations from the substrate. Vertical lines 6 show the dislocations which grow upward in parallel with the direction of growth in the GaN film.

When the windows are filled with the triangle ridges 4, the GaN layers protrude from the windows and extend horizontally over the mask 2 as shown in FIG. 16. During the horizontal growth, the heights of the layers are kept at a constant. The frontiers are facet planes 9 of (11$\bar{2}$2) and ($\bar{1}\bar{1}$22). The frontier facets 9 extend horizontally. The direction of the extension of dislocations turns to the horizontal directions. Horizontal lines 7 show the horizontal dislocations.

In the meantime, the GaN grains growing horizontally from neighboring windows meet at the middle points and unite soon together. The facets of (11$\bar{2}$2) and ($\bar{1}\bar{1}$22) vanish. The surface of the united GaN grains becomes smooth and flat. The dislocations are gathered into the middle planes 11 as shown in FIG. 17. The planes 11 are called "defect assembly plane". Then, the GaN crystal grows in two-dimension on c-plane (0001), keeping a mirror flat surface 10. It is not easy to maintain the mirror-plane growth. But they believe that the mirror-plane growth should be kept even at the intermediate steps for making a flat smooth GaN single crystal. Fine regulation of the gas pressures, gas supplies and temperature keeps the flat smooth surface of the GaN crystal. FIG. 17 shows the smooth flat surface of c-plane (0001) after the integration of the grains.

Someone reports the fact that the penetration dislocations are reduced in the overgrowing grains extending horizontally over the mask on which the extending directions of the dislocations are horizontal as shown in FIG. 16. ⑤ gave attention to the reduction and considered the ground of the reduction of dislocations over the mask. The following is the explanation given by ⑤. When the crystal grows in the c-axis direction with a c-plane surface, the dislocations extend in the c-axis direction. The penetration dislocations continue in the c-axis direction. The extension of the penetration dislocations follows the direction of the growth in many cases. When the GaN crystal grains grow in the horizontal direction over the mask, as shown in FIG. 16, the penetration dislocations turn to the horizontal directions. The turn of the extending directions would reduce the density of the penetration dislocations along the c-axis.

The previous report ⑤ tells us that the GaN crystals grow in the vertical direction within the windows on the GaAs substrate, the crystals start to grow in the horizontal directions over the mask and the grains expanding from the neighboring windows are integrated together at the middle lines. Planar defect assemblies 11 are formed on the integration lines as shown in FIG. 17. The planar defect assemblies diminish as the thickness of the flat crystal increases. ④ says, when the thickness increased over 140 $\mu$m, the planar defect assemblies are extinguished. Then, ④ insists that they succeeded in reducing the EPD of GaN below $10^7$ $cm^{-2}$ by the lateral overgrowth method based upon the mask with windows.

The Inventors of the present invention made GaN crystals by the lateral overgrowth method and scrutinized the details of the growth. In the following description, the word "facet" means any faces except the c-plane (0001) surface for discriminating slanting growths from the vertical growth on the c-plane (0001).

The grains extending from the windows are integrated with at a thickness of about 6 $\mu$m. Then, the crystal grows in two dimensions vertically on the flat c-plane, piling c-planes one by one. The two dimensional growth maintains the mirror flatness of the surface. The Inventors made various GaN crystals from a 0.2 mm thickness to a 0.6 mm thickness. The lateral overgrowth method decreased the dislocation density till about $1 \times 10^7$ $cm^{-2}$. However, the method could not reduce the dislocation to low density of less than $1 \times 10^7$ $cm^{-2}$. The GaN crystals were not good enough to be a substrate for making LDs.

The Inventors have considered the reason why the dislocations do not decrease below $1 \times 10^7$ $cm^{-2}$ as follows. As long as the GaN crystal continues the simple two-dimensional growth in the c-axis direction keeping the flat mirror surface, the penetration dislocations bluntly extend in the c-axis direction, following the growth. The dislocations freely expand upward with the progress of the c-axis growth. There is no function of eliminating the dislocations in the two-dimensional c-axis growth. The c-axis growth keeping a flat smooth c-plane cannot annihilate the dislocations which have once been borne.

Another problem accompanies the prior mirror surface growth which grows the GaN crystal at a constant speed in the c-axis direction. The mirror surface growth has a drawback of requiring high temperature. The high temperature gives serious damage to the GaAs substrate which is weak to heat. The high temperature incurs no problem for the conventional sapphire substrate which has far higher resistance against heat than GaAs. However, the GaAs substrate requires lower temperature than the conventional sapphire substrate. The Inventors prefer the GaAs substrate to the sapphire substrate for the mentioned reasons. Besides, the GaAs substrate can be easily removed by etching after the GaN growth unlike the sapphire which cannot be eliminated due to the chemical stubbornness.

The consideration should be returned to the problem of the dislocations. The reduction of the dislocations requires some special device for annihilating the dislocations which have once been generated. The prior c-axis growth keeping the mirror c-plane has no device of annihilating the dislocations.

The Inventors hit on an idea of installing a dislocation-annihilation device in growing crystals and maintaining the dislocation-annihilation device during the growth for reducing the dislocations. The dislocation-annihilation device is a new concept which characterizes the present invention. The dislocation annihilation device reduces the dislocation density by killing the dislocations during the crystal growth.

The Inventors have investigated and found the method which enables us to originate the dislocation-annihilation device, grow a GaN single crystal under the influence of the dislocation-annihilation device and reduce the dislocations.

The present invention denies the prior two-dimensional growth of keeping the mirror flat c-plane surface but proposes a facet-keeping growth of making facets, keeping the facets and annihilating dislocations by the facets. The facets were previously defined as any planes on the surface except the c-plane. The facets are slanting planes on the growing surface except the c-plane. The dislocation-annihilation device is the facets. The Inventors have discovered a novel fact that the facets have the function of annihilating the dislocations. Nobody has suggested the function of the facets before the Inventors. The prior two-dimensional mirror surface growth denied the facets since the facets are origin of rugged surface and are the enemy of the mirror surface growth. On the contrary, the present invention positively produces the facets by controlling the condition of the growth and annihilates dislocations by the function of the facets. The facets correspond to some low index planes. Since GaN crystal has hexagonal symmetry, the facets belonging to the same collective index planes represent different slanting directions with the same slanting angle to the c-axis. Neighboring facets have a boundary. The facet-keeping growth gathers the dislocations to the boundary. The facet boundary forms a "dislocation accumulating plane". The crossing point of the dislocation accumulating planes makes a "dislocation bundle line" which accumulates plenty of dislocations. The facets kill the dislocations. The dislocation-annihilating device is the facets in the present invention. The exploitation of the facets enables the present invention to reduce the dislocation density to less than $10^6 cm^{-2}$ which is about one tenth of the prior method. Surprisingly, the present invention allows us to make a low-dislocation GaN single crystal of about $10^4$ $cm^{-2}$ to $5 \times 10^3$ $cm^{-2}$.

The facet is not a c-plane but a plane which is not orthogonal to the growing direction (c-axis). The prior method makes efforts to grow a GaN crystal, keeping a flat, smooth surface of the c-plane without facets. The facets are undesirable defects for the prior method. The prior method excludes the facets. The present invention recommends the generation of the facets, distributes the facets uniformly and reduces the dislocations by the facets to the contrary. The present invention succeeds in producing low-dislocation GaN crystals by exploiting the function of the facets. Low-dislocation GaN substrates can be produced by cutting the low-dislocation GaN crystal made by the present invention into thin wafers. The substrates are the best GaN substrates for blue light lasers (LDs) or violet light lasers (LDs).

The method of the present invention includes the conditions of:

(1) generating facets and growing a crystal without vanishing the facets till the end of the growth, (2) keeping boundaries between the neighboring facets and (3) maintaining dislocation-accumulating planes as sets of cross points of the facets.

These restrictions enable this invention to succeed in producing a low-dislocation GaN single crystal of dislocation density of less than $10^6$ cm$^{-2}$ for the first time.

The fundamental idea is rather difficult to understand. Thus, the present invention requires detailed explanation. Facets are low-index planes except the c-plane which is the growth surface, since the growth is done in the c-axis direction. All the planes of the grains on the surface except the c-plane are facets. The definitions of the planes, the directions and the indexes are now clarified.

GaN (gallium nitride) crystal belongs to the hexagonal symmetry group which has six-fold rotation symmetry around the c-axis. Four index number is now employed to describe planes and directions on crystallography. The a-axis and b-axis are vertical to the c-axis. The a-axis inclines at 120 degrees to the b-axis. The length of the a-axis is equal to the length of the b-axis (a=b). The length of the c-axis is not equal to the length of the a-axis or b-axis (a≠c). Besides the a-axis and b-axis, an extra d-axis is assumed on the ab-plane for giving rotational symmetry to the mirror indexes. The d-axis inclines at 120 degrees to the a-axis and at 120 degrees to the b-axis. A rotation of 120 degrees on the c-axis moves the a-, b-, d-axes to the b-, d-, a-axes respectively. Since the extra d-axis has been introduced for giving rotation symmetry to the indexes, the three indexes are not independent. One set of parallel planes are denoted by a mirror index (klmn). The index (klmn) means that the first plane cuts the a-axis at a/k, the b-axis at b/l, the d-axis at d/m and the c-axis at c/n. The definition of the mirror index is common to other symmetry groups. Since the a-, b- and d-axes are included in the ab-plane, the numbers k, l and m are not independent. Three indexes k, l and m always satisfy a sum rule of k+l+m=0. The three index numbers have rotational symmetry. The rotational symmetry is equivalent to the sum rule of k+l+m=0.

Individual planes should be denoted by a round bracket ( . . . ). Collective planes should be denoted by a wavy bracket { . . . }. The "collective" means a set of all individual planes which can be interchanged with another member by the symmetry operations allowed by the crystal group. The direction is denoted by the same mirror index as the plane perpendicular to the direction. Individual directions should be designated by a square bracket [ . . . ]. Collective directions should be denoted by a triangle bracket < . . . >.

GaN crystal is grown in the c-axis direction on the c-plane which has six equivalent axes. The facets are defined as planes except the c-plane (0001). If any of k, l and m of a plane is not zero, the plane is a facet on the surface. There are, however, some distinctions among the facets. Some facets are apt to appear on the surface. But other facets do not easily appear on the surface. Important facets which often appear on the growing crystal are {1$\bar{2}$12}, {1$\bar{2}$11}, {n$\bar{2}$nnk} (n,k=integer), {1$\bar{1}$01}, {1$\bar{1}$02}, {nn0k} (n,k=integer), Here, {1$\bar{2}$12} means that k=1, l=−2, m=1, n=2. As explained before { . . . } signifies collective planes. For example, {1$\bar{2}$12} includes six equivalent planes (1$\bar{2}$12), (2$\bar{1}$$\bar{1}$2), (11$\bar{2}$2), ($\bar{1}$2$\bar{1}$2), ($\bar{2}$112) and ($\bar{1}\bar{1}$). The six planes form a six-fold concave on the surface. However, the six individual indexes are not written hereinafter for simplicity. The six planes building the six-fold concave are simply denoted by {1$\bar{2}$12}. The facets {1$\bar{2}$12} signify the six equivalent facets. On the contrary, other expressions {2$\bar{1}\bar{1}$2)} or {11$\bar{2}$2)} are equivalent to {1$\bar{2}$12}.

The fundamental principle basing the present invention is reduced to the function of the facets of sweeping and gathering defects, e.g., dislocations, to the boundaries (dislocation accumulating planes) of different index facets or gathering the defects to the center line (dislocation bundle line) of the different index facets.

Since the dislocations are swept and gathered to the boundaries of the facets and the center lines of the facets, the dislocations existing in other parts are reduced to the contrary. The quality of the crystal is enhanced by the reduction of the dislocations. However, the number of the dislocations localized at the boundaries (dislocation accumulating planes) and the central lines (dislocation bundle line) is increasing. The above is a brief explanation of the principle of the present invention.

A more detailed explanation is given from now. It may be difficult to understand the ground that the facets have the function of gathering the dislocations. At first, the change of the dislocation expansion is explained. Then, the accumulation of the dislocations is clarified.

The direction of the extension of dislocations depends upon the direction of the crystal growth. In the case of GaN crystal, the dislocations progress in the c-axis direction when the GaN crystal is growing two-dimensionally in the c-axis direction within the mask windows. However, when the top of the crystal rises over the mask thickness, the grain frontier begins to extend in the horizontal directions on the mask. When the growing direction is changed to the horizontal mode, the extending directions of the dislocations are also changed into the horizontal directions. The prior art of the lateral overgrowth method reported the horizontal extension of the dislocations in the horizontal growth on the mask. Namely, the direction of the extension of the dislocations follows the direction of the crystal growth.

The steps of the lateral overgrowth are again considered by referring to FIG. 14 to FIG. 17. FIG. 14 shows a starting substrate 1 having a mask 2 with windows 3. FIG. 15 shows a intermediate state in which GaN grains 4 grow only on the exposed GaAs substrate 1 within the isolated windows 3. The GaN grains 4 cannot grow on the mask 2. The grains 4 are triangle-sectioned cones having slanting planes 5 (facets). Dislocations 6 extend upward in the cones as depicted by narrow lines. The slanting angles of the facets 5 are predetermined. When the GaN cones 4 fill the windows 3, the GaN crystal grow over the windows 3 and ride on the mask material 2 as shown in FIG. 16. Frontier facets 9 progress in the horizontal directions in the ab-plane on the mask 2, keeping a definite slanting angle. The vertical dislocations 6 turn to be horizontal dislocations 7 at turning planes 8 and extend in the horizontal directions. Soon neighboring GaN grains come into contact at the middle planes between the windows. The facet frontiers 9 collide with together and vanish at the middle planes. The dislocations 7 end on the meeting planes 11. The middle planes 11 include plenty of dislocations. Some dislocations vanish on the middle planes 11. Then, the direction of the GaN crystal growth turns again. GaN crystal 10 begins to grow in the vertical direction, keeping a flat, mirror-smooth surface of a c-plane.

In stead of the mirror surface growth without facets of FIG. 17, this invention prefers a rugged surface growth having plenty of facets in the c-axis direction. This invention denies the prior mirror-surface growth but chooses a rugged, rough surface growth accompanied with many facets and with boundaries. The boundary is defined as the crossing line at which two facets meet together. Since the facet is a plane, the boundary is a straight line. A six-folding facet cone has six boundaries. There are two cases for the crossing angles between the neighboring facets.

(1) In the case of a facet-crossing angle below 180 degrees (FIG. 1)

The first case is that the crossing angle between the neighboring facets of different indexes is less than 180 degrees. FIG. 1 shows an example of the crossing angle of less 180 degrees. A pyramid having four slanting planes Fa, Fb and so on is put on a square column. The number of facets is arbitrary. Typical facet number of the pyramid is six or twelve from the symmetry. But other sets of facet numbers sometimes exist. The set of the facets is called a convex-type which projects as a pyramid on the growing surface. The crossing angle is defined as the inner crossing angle between the facets. The convex-type set has a crossing angle below 180 degrees. Two facets Fa and Fb shown by hatched lines have a crossing line m. The average growth direction is the c-axis direction.

Individual growing directions on the facets Fa and Fb are denoted by arrows A and B. Namely, the individual growing directions A and B are obtained by projecting the normals standing on the facets Fa and Fb from the bottom planes. The dislocations expand in the same directions as the individual growing directions A and B. The dislocations direct outward on the convex pyramid. The dislocations separate farther from the boundary m. Since the dislocations disperse outward, the dislocations do not cross each other, as shown in FIG. 2. The crystal growth succeeds the undercoating crystal. The difference of the indexes may induce difference of the impurity concentration on the different planes. The crystal takes over the defects of the undercoating crystal. The number of the dislocations is not changed. FIG. 3 shows a state of the convex type facets set. The height uniformly increases without changing the shape. The dislocations do not reduce. Namely, the crossing angle below 180 degrees has no function of reducing the dislocations.

2 In the case of a facet-crossing angle over 180 degrees (FIG. 4)

The second case is that the crossing angle between the neighboring facets of different indexes is more than 180 degrees. FIG. 4 shows an example of the crossing angle of more than 180 degrees. A part of a concave having several slanting planes Fa, Fb and so on is depicted. The number of facets of a concave is arbitrary. Typical facet number of the concave is six or twelve from the symmetry. But other sets of facet numbers sometimes exist. The set of the facets is called a "concave-type" which makes many holes on the growing surface. The concave-type set has a crossing angle over 180 degrees. Two facets Fa and Fb shown by hatched lines have a crossing line m. The average growth direction is the c-axis direction. Individual growing directions on the facets Fa and Fb are denoted by arrows A and B. Namely, the individual growing directions A and B are obtained by projecting the normals standing on the facets Fa and Fb from the bottom planes. The dislocations move in the same directions as the individual growing directions A and B. The dislocations direct inward in the concave. The dislocations are swept into the boundary m by the progress of the individual growth. The dislocations finally reach the boundary m. The boundary m is shot by the dislocations moving from two facets. The dislocations are stopped at the boundary m. The dislocations cannot extend further on the other facet. Since the facets are concave, the dislocations are swept and gathered at the boundary m as shown in FIG. 6. Then, the dislocations turn down along the boundary m. The boundary accumulates the dislocations.

Since the crystal growth continues in the c-axis direction, the boundary forms a plane at the middle of the facets as shown in FIG. 6. The dislocations are accumulated and buried in the middle plane K which is called a defect accumulating plane K The defect accumulating plane K grows upward according to the progress of the growth. The defect accumulating plane K can be a small angle grain boundary. The defect accumulating plane K is a bisecting plane between the neighboring facets Fa and Fb.

The dislocations on the facets are gradually absorbed by the defect accumulating planes K and are vanishing from the facets. The dislocations further progress slantingly downward from the defect accumulating planes K to the central axial lines. As the crystal growth continues, the defects are swept and gathered into the central axial lines of the set of the facets. This is the principle on which the present invention is based. A set of the facets of above 180 degree crossing angle have such a defect annihilating effect, as explained by FIG. 4 to FIG. 6.

Then, the case of the facets having a common accumulating line is explained. FIG. 7 shows a more concrete set of facets forming a pit than FIG. 4, FIG. 5 and FIG. 6. Practical experiment of growing GaN crystal shows us that the convex-type facets of FIG. 1 to FIG. 3 do not appear at all but the concave-type facets of FIG. 4 to FIG. 6 do appear on the GaN growing crystal surface. The convex-type facets of FIG. 1 to FIG. 3 which would disperses dislocations does not occur in practice. This is a happy asymmetric phenomenon. This invention makes the best use of the fortunate asymmetry.

FIG. 7 shows a six-fold reverse-cone pit EGHIJN-D having facets of $\{1\bar{2}12\}$. The average growth S is directed upward in the c-axis direction. In the six-fold pit, individual growing directions A, B . . . are normal to the facets as shown by arrows or the inward directions from the facets to the central axial line. Dislocations accompany the growing direction. Since the individual growth is direct inward, the dislocations expand also inward as shown in FIG. 8. The six facets grow at a common speed. The dislocations attain at the boundaries between m the facets.

Another problem is whether these dislocations would cross the lines K and extend into the neighboring facets. The facet Fb has the individual growing direction B and the dislocation-extending direction b which is parallel with B. If the dislocations moving from the facet Fa would be assigned to the dislocations of the facet Fb, the dislocation S should turn the moving direction at an angle of 60 degrees. The 60 degree turn is impossible for the dislocations. The dislocations follow the growth. The dislocations cannot jump to the neighboring facets. The dislocations either vanish on the boundary or survive in the boundary m. Since the boundaries are abnormal lines in the growth, the boundaries admit the dislocations to invade in the lines. But the dislocations cannot escape from the boundaries again.

In practice, the average growth is direct upward. The hexagonal pit is buried by the newly-growing crystal. However, the pit does not diminish, because the top aperture has a tendency of widening. The tendency of widening balances with the upward growth. Thus, the hexagonal pit moves upward without diminishing. V denotes the growing speed in the c-axis direction. The slanting angle of the facet is designated by θ. If the growing speed of the facet in the normal direction is V sin θ, the pit is slightly upward displaced at the speed of V without deforming. As sheets of crystal is piled, the previous dislocations are buried in the boundaries. The boundaries gather and hold many dislocations. Since the dislocations are swept, gathered and maintained in the boundaries, the dislocation density decreases at other parts.

The dislocations are stored in the bisecting planes between the neighboring facets. The planes are called "defect accumulating planes" K. FIG. 9 shows the planes K. The defect accumulating planes K are rotationally symmetric on the central axis of the pit, meeting each other at 60 degrees.

Since the average growth progresses upward, the dislocations on the boundaries move toward the central line. Namely, the dislocations seem to slide down along the boundaries to the central line. The line which is a locus of the "multidefect points" D including plenty of dislocations is called a "defect accumulating line" L.

Many dislocations moving from all the facets in the pit and small-angle grains are unified and integrated at the multidefect point D. Then nearly all of the defects on the facets in the pit are gathered to the multidefect point D. Some defects vanish in the meantime of the movement. All the other defects are collected to the multidefect point D.

As the vertical growth continues, the defects are left in the vertical line (defect accumulating line L) extending below the current multidefect point D. The six boundaries leave similarly six defect accumulating planes K and the small-angle grains as the growth progresses.

The planar defects groups (defect accumulating planes) K, the small angle grains and the linear defect assemblies (defect accumulating lines) L remain in the growing crystal. Defects are condensed into the linear or planar defect assemblies. However, the total of the defects surely decreases. Some of the dislocations vanish when they meet the boundaries. Some dislocations are extinguished when the boundaries meet the central linear defect lines L. Some defects are annihilated by interactions when they are compressed in a narrow space in the defect assembling lines L or the defect assembling planes K. For example, a collision of blade-type dislocations kills the dislocations. The defects decrease with the progress of the growth.

The formation of the defect accumulating planes K and defect accumulating lines L depend upon the condition of the growth. Optimization of the growing conditions enables the crystal to decrease the planar defect assemblies K and linear defect assemblies L. Selection of the growing condition can vanish the small angle grains and planar defect assemblies. In this case the crystal has a good property.

On the contrary, other choice of the growing conditions positively produces the planar defects assemblies, linear defect assemblies and small angle grains which gather many individual defects. The linear defect assembly is counted as one defect in the EPD (Etch Pit Density) measurement. The generation of the linear defect assemblies has an effect of reducing the measured defect density. For example, if one multidefect point includes about 10000 dislocations, the EPD seems to decrease to one thousandth (1/1000).

The method of decreasing defects of the present invention has been clarified hitherto. An important problem is still left unexplained. The reduction method explained till now is restricted to the region at which facets exist because the reduction is originated from the facet growth. If the crystal surface includes smooth, flat c-axis growing parts without facets, the flat regions would be free from the function of reducing defects. The normal c-axis growth expands parallely dislocations in the c-axis direction without reducing the dislocations.

FIG. 11 shows a section of a growing GaN crystal. The upward arrow denotes the growing direction or time. The height z increases as a function of time. Thus, the height of the crystal is equivalent to time of the growth. The hatched parts (s) denote the c-axis growing regions. The blank parts (w) show the facet-growing regions. FIG. 11 denotes the sections of the smooth, flat c-axis growing regions (s) and the rugged facet-growing regions (w). FIG. 11 shows the case assuming the unchanging sections of the flat c-axis growing regions and the rugged facet-growing regions. This is only an imaginary scheme for facilitating the explanation. The boundaries (q) are between the smooth c-axis growing regions (s) and the rugged facet-carrying growth regions (w). In the case, the boundaries (q) are parallel with the direction of the growth. The regions (w) with the facets have the dislocations reduction effects. The regions (s) have no effect of reducing the dislocations. The initial EPD in the crystal is denoted by "Q". The EPD is kept in the hatched regions (s) ruled by the smooth c-axis growth. Even if the EPD is reduced to zero at the white regions (w) of the facet-growth, the final EPD would be restricted to EPD=Qs/(s+w), where s is the sectional area of the hatched region of the c-axis growth and w is the sectional area of the blank regions of the facet-growth. The reduction ratio of the EPD would be only s/(s+w). The ratio is about 1/2 or 1/3 at most. But it is not the fact. The reduction rate of the present invention is about 1/10000.

This invention can offer a sophisticated solution for reducing drastically the EPD.

The formation of the facets depends upon the conditions of growth. For example, the partial pressure of $NH_3$, the growing speed of GaN, the growing temperature and the gas supply mode rule the formation of facets. This invention generates facet-growth and maintains the facet-growth by controlling the growth conditions in the manner for forbidding the mirror-surface growth. The present invention prefers the facet-growth to the mirror surface growth. This invention entirely contradicts to the prior GaN growing method which prefers the smooth mirror-surface growth.

The mirror-surface growth (conventional) and the facet-driven growth (this invention) can be selected by the growing conditions. For example, higher temperature is liable to induce the mirror-surface growth and has a tendency of preventing the facet-driven growth. Lower temperature is apt to realize the facet growth in stead of the mirror growth. Slower speed of growth has a tendency of causing the mirror-surface growth. Faster growing speed is liable to induce the facet growth. Lower $NH_3$ partial pressure is favorable for the mirror-surface growth. The facet-growth can be triggered by enhancing the $NH_3$ partial pressure. Lower HCl partial pressure prefers the mirror-surface growth. Enhancement of the HCl partial pressure facilitates the facet-growth. In general, the favorable conditions for the facet growth are contrary to those for the mirror-surface growth. The determination of the conditions reverse to the mirror-surface growth can realize the facet-growth in general.

The present invention tries to allocate at least one experience of the facet-driven growth to all the longitudinal regions (columns) divided along the growing (thickness) direction by changing the growing conditions in various ways. The fact that the divided longitudinal regions (columns) have an experience of the facet-growth is now called the "facet growth hysteresis". Any column having once the facet growth hysteresis can exclude the seeds of dislocations by the facet-growing. The column is cleaned by the facet-growth. Once cleaned column is immune from the dislocations, even if the column part begins the mirror-surface growth, because the column has no seeds of dislocations. Allocation of the facet-growth hysteresis to all the columns imagined in the crystal can make a low-dislocation crystal as a whole. This invention reduces the dislocations of all the regions by allotting all the regions the facet-growth hysteresis. This is an excellent feature of the present invention. The gist of the present invention is again clarified more rigorously. The three dimensional coordinate is defined. The vertical coordinate is denoted by "z". Since the crystal grows in the upward direction, the time of growth is equivalent to the z-coordinate of the surface. The surface of the substrate is denoted by the x- and y-coordinates. Thus, three dimensional coordinate (x,y,z) is defined in the GaN growing crystal. A three-dimensional facet-characteristic function w(x,y,z) is introduced for clarifying the explanation. If the point (x,y,z) is the facet-growing part, w(x,y,z) is 1. If the point (x,y,z) is the mirror-growing part, w(x,y,z) takes 0. Namely, $w(x,y,z)=0$ for point (x,y,z) of mirror-surface growth $w(x,y,z)=1$ for point (x,y,z) of facet-driving growth.

For example, in FIG. 12, the hatched regions (s) give $w(x,y,z)=0$ and the blank regions (w) give $w(x,y,z)=1$. Thus, $w(x,y,z)$ is a localized function at a point (x,y,z). Now a two-dimensional hysteresis function W(x,y) is further defined upon the facet-characteristic function w(x,y,z). A normal line is projected from an arbitrary point (x,y) on the surface to the bottom of the crystal. If the normal line passes points of $w(x,y,z)=1$ at least one time, the hysteresis function W(x,y) is defined to be 1. If the normal line does not meet a point of $w(x,y,z)=1$, the hysteresis function W(x,y) is defined to be 0. In other words, if there is at least a point (x,y,z) of $w(x,y,z)=1$ for $0 \leq z \leq H$ (height of the crystal), the hysteresis function W(x,y) for the (x,y) is determined to be 1. If there is no point (x,y,z) of $w(x,y,z)=1$ for $0 \leq z \leq H$ (height of the crystal), the hysteresis function W(x,y) for the (x,y) is defined to be 0.

$$W(x,y) = \max_z \{w(x,y,z)\}$$

where $\max_z$ means taking the maximum value for a variable z from z=0 to z=H. If the hysteresis function W(x,y) is 1, the column (x,y) has a facet-growth part at some point from z=0 to z=H of the two-dimensional point (x,y). If all the surface points (x,y) has W(x,y)=1, all the points have the facet-growth hysteresis at some height z.

FIG. 12 shows the section of an example having fluctuating facet-growing regions and mirror-surface growing regions. The blank parts are facet-growing regions which have the function of annihilating dislocations. The hatched parts are mirror-surface growing regions which have no function of reducing dislocations. The example of FIG. 12 has wide facet-growing regions at the beginning. The facet-growing regions have already absorbed dislocations as planar defect assemblies and linear defect assemblies. If the mirror-surface c-axis growth succeeds, the facet-growth, dislocations do not extend any more, since the dislocations have been annihilated. In FIG. 12, any regions preceded by the blank regions are immune from dislocations. Thus, even if the hatched regions of the mirror-surface growth dilates at a later step, the low-dislocation is maintained in the GaN crystal. The reduction of the dislocations is not directly proportional to the rate of the facet-growing regions at some height but proportional to the rate of the facet-growing hysteresis regions.

FIG. 13 shows another example of more an extreme case having a height in which all the parts are facet-growing regions (w) at an early stage. At the horizontal level, facet-growing occurs at all the parts and dislocations are decreased by the facet-growth. Once the dislocations are annihilated at the level. Even if the mirror-surface growth follows some parts, the mirror-surface growth does not transcribe the dislocations since the seeds of the dislocations have been excluded there. Horizontal fluctuations of the facet-growing regions positively reduce the dislocation density all over the surface by annihilating the sees of the dislocations at some height of the imaginary columns. It is desirable that the facet-growing regions move in the horizontal directions for decreasing the defects.

A columnar region would have little dislocation density so long as the region has the facet-growing hysteresis at some height. The etch pit density at a time (t) or at a height (z) is not determined by the distribution of the facet-growing regions and the mirror-surface growing regions at the present height. If a region having a facet-growth experience is growing in the mirror surface at present, the regions can be low dislocation density. The dislocations density is ruled by the distribution of the facet-growing hysteresis. The facet-maintaining growth sweeps and decreases the dislocations to the multidefect planes (defect accumulating planes) K or the defect-accumulating lines L. If the defect-annihilating function were restricted at the present surface of the growing crystal, the dislocation density would simply be decreased to a rate of (W−F)/W, where W is the total area, F is the facet-growing area and (W−F) is the mirror-growing area. Since (W−F)/W is a number of an order of 1, the drastic reduction of an order of $10^{-4}$ to $10^{-3}$ would not occur. The magical reduction is encouraged by the vertical history of the facet-growth in any imaginary columns. If a vertical column has an experience of the facet-growth at a time, the column enjoys the merit of the low dislocation density in future. The surprising reduction of an order of $10^{-4}$ to $10^{-3}$ results from the fact that the memory of the facet-growth for decreasing the dislocations is maintained in the vertical directions.

It is preferable to give the facet-growing hysteresis at an early stage of growth. In the case of making a long crystal ingot, an early facet-growing experience is effective for producing a good crystal having low density of dislocations. In any virtual vertical columns, the initial mirror-growing portions have high density of dislocations, a facet-growing occurs some time, and low dislocation density portions follow the facet-growing regions.

The facet-maintaining growth is realized by the operation of decreasing the temperature, enhancing the HCl partial pressure, raising the $NH_3$ partial pressure, or heightening the growth speed. The facet-growth hysteresis is given to all the vertical virtual columns by one or a couple of the above-cited operations. Otherwise, an unintentional, natural change of growing conditions sometimes endows the portion with the facet-growth and the facet-growth hysteresis.

The present invention grows a GaN crystal, removing the dislocations. The GaN crystal made by the present invention includes planar defect regions, small angle grains and linear defect assemblies which contain plenty of dislocations. Other regions except the defect assembling portions contain little dislocations. The other regions are nearly dislocation-free. The GaN crystal ingots have low density of dislocations. The crystal property is improved. The wafers sliced from the GaN ingot are low-dislocation density wafers. The GaN wafers can be the substrates for making laser diodes (LDs).

The present invention explained hereto contains the fundamental ideas of;

(1) the reduction of dislocations by sweeping the dislocations to the boundaries between neighboring facets, (2) the formation of the defect-accumulating planes by assembling the dislocations just below the boundaries, (3) the prevention of the dislocations from diffusing by integration and accumulation of the dislocations at the confluences of the facets, (4) the formation of the defect-accumulating lines below the confluences (multi-defect point) by the accumulation of the dislocations, (5) the increment of the low-dislocation portions by the increase of the face-growth hysteresis regions.

These functions enable this invention to obtain low-dislocation GaN single crystal which is immune from dislocations except the defect-accumulating lines. The defect-accumulating lines is a bundle of dislocations. When the EPD (etch pit density) is measured by a microscope observation, one defect-accumulating line is counted as one etch pit. If a defect-accumulating line (linear defect assembly) is a bundle of about $10^4$ dislocations, the formation of the defect-accumulating lines enables the present invention to decrease, for example, about $10^8$ cm$^{-2}$ dislocations to about $10^4$ cm$^{-2}$ dislocations. The reduction rate is about $10^{-4}$.

The fundamentals of the present invention have been explained. Furthermore, details of the present invention will be clarified with reference to the restrictions of the claims. The present invention is a method of growing a low dislocation density GaN single crystal by the facet-driving growth generating and maintaining the facets throughout the process instead of the mirror-surface maintaining method. Namely, the GaN crystal is grown on the conditions making and keeping three dimensional facet structure and avoiding the mirror-surface growth.

The three-dimensional facet structure is a set of polygonal cones with facets or complexities of pits having facets.

The present invention suggests a method of growing a gallium nitride (GaN) single crystal maintaining the facet structure and reducing defects by producing defect accumulating planes which are vertical to the average growing surface.

The present invention proposes a method of growing a GaN single crystal maintaining the facet structure and reducing defects by producing defect-accumulating lines which are vertical to the average growing surface.

The facet structure contains polygonal pits. The pits have slanting side walls. The orientations of the side walls are mainly $\{11\bar{2}2\}$. Then most of the pits are hexagonal conical pits enclosed by the six equivalent $\{11\bar{2}2\}$ planes. The neighboring $\{11\bar{2}2\}$ planes meet at nearly 120 degrees. With a lower probability, $\{1\bar{1}01\}$ planes appear as pit walls. In the case, the pits are twelve-fold cones having six $\{11\bar{2}2\}$ planes and six $\{1\bar{1}01\}$ planes. The neighboring walls meet at nearly 150 degrees. Experiments teach us that sets of facets form concaves (pits) in most cases. The facet structure rarely produces convexes (protrusions). This is a favorable property for the present invention. As mentioned before, the convex facets have no function of reducing dislocations. Only the concave facets have the desirable function of reducing dislocations. The facets appearing frequently on the facet-driving growth are $\{11\bar{2}2\}$, $\{1211\}$, $\{n\ 2\bar{n}\ n\ k\}$(n, k; integers), $\{1\bar{1}01\}$, $\{1\bar{1}02\}$, $\{n\ \bar{n}\ 0\ k\}$(n, k; integers).

The present invention further proposes a method of growing a low dislocation density GaN single crystal by producing and maintaining facets, making concaves (pits) of three dimensional facet structure, sweeping dislocations and assembling the dislocations in the defect-accumulating lines which are vertical to the average growing plane. When the facet structure is a hexagonal conical pit, the defect-accumulating line extends below from the bottom of the pit.

The present invention proposes moreover a method of growing a low dislocation density GaN single crystal by maintaining facets, making concaves (pits) of three dimensional facet structure, sweeping dislocations, assembling the dislocations in the defect-accumulating planes extending just below the boundaries of the facets and decreasing the dislocations.

The present invention further proposes a method of growing a low dislocation density GaN single crystal by maintaining facets, making hexagonal conical pits of three dimensional facet structure, sweeping dislocations on the facets, assembling the dislocations in the defect-accumulating planes extending radially from the axis and meeting together at 60 degrees.

The present invention further proposes a method of growing a low dislocation density GaN single crystal by maintaining facets, moving the facet-lying regions in the horizontal directions, giving facet-growth hysteresis to all the vertical columnar regions, and reducing the dislocations by making the regions experience the facet-growth.

Most frequently appearing facet planes are $\{11\bar{2}2\}$ planes. In the case, the planar defect-accumulating assemblies have orientations of $\{11\bar{2}0\}$. Sometimes the defect-accumulating planes are small angle grains.

The important matter for the present invention is to maintain the facet structure during the growth. The direction of the growth is optional. For example, a low dislocation density GaN crystal can be grown in the $\{11\bar{2}0\}$ directions or $\{1\bar{1}00\}$ directions. The c-axis growth is the most effective for reducing the dislocations.

The dislocation reduction of the present invention requires more than 10% of the facet rate F/W of the three-dimensional facet-wearing area F to the total surface W of both the GaN crystal growing in the vapor phase and the GaN crystal grown up. Namely, F/W$\geq$0.1. Here, the three dimensional facet structure includes the pits having facets and the assemblies of the pits.

A further reduction of the dislocations requires more than 40% of the facet rate F/W of the three-dimensional facet-wearing area F to the total surface W of both the GaN crystal growing in the vapor phase and the GaN crystal grown up. Namely, F/W$\geq$0.4. The GaN crystal should be covered with the facet structure of the pits with wide areas for decreasing the dislocations by the facets.

A more effective reduction of the dislocations requires more than 80% of the facet rate F/W. F/W$\geq$0.8. When the facet rate F/W is more than 80%, the growing pits come in contact with each other.

100% of the facet rate F/W accomplishes the maximum reduction of the dislocations. Namely, F/W=1. All the growing pits and the assemblies of the pits are in contact with each other. There is no c-plane part on the surface.

The above-mentioned relates to the crystal growth in which all the facets have clear orientations. The Inventors confirmed that even the case in which the facets having obscure orientations occupy the surface enjoys the dislocation reduction effect by the facets. For example, the Inventors examined the GaN growth case in which round hexagonal conical pits occupy the surface. The round pits have the power of sweeping and storing dislocations to the boundaries. Even the round pits have surely some boundaries between the facets and the boundaries gather dislocations.

This invention includes the case in which the growth pits and the assemblies of the pits on the surface after the vapor phase growth include curvatures deviating from the facets with definite crystal indices. The curvatures have the function of the eliminating dislocations from the curvatures to boundaries.

This invention further includes the case in which the growth pits and the assemblies of the pits on the surface after the vapor phase growth have more than 10% occupation rate on the surface and all the pits and the assemblies are built by the curvatures deviating from the facets with definite indices.

The desirable range of the diameters of the pits consisting of the facets or the complex pits as assemblies of the pits is 10 μm to 2000 μm. Too small diameter of the pits has poor effect of reducing the dislocations. Too big diameter of the pits is uneconomical by increasing the loss on the polishing process which eliminates the pits and obtains a smooth surface.

The minimum record of EPD of GaN crystals was $10^7$ $cm^{-2}$. The present invention succeeds in making a low dislocation density GaN single crystal having EPD of less than $10^6$ $cm^{-2}$. The present invention enables makers to produce low dislocation density GaN single crystals on an industrial scale. The low dislocation density GaN single crystal substrates allow device makers to make long lifetime, high quality, high power blue/violet light semiconductor laser diodes.

BRIEF DESCRIPTION OF THE DRAWINGS

FIG. 14 a sectional view of a first step of the lateral overgrowth of a GaN single crystal showing a substrate, a mask coating the substrate and windows perforated on the mask.

FIG. 15 a sectional view of a second step of the lateral overgrowth of a GaN single crystal showing the substrate, mask, windows and triangular GaN protrusions with slanting facets projecting from the windows.

FIG. 16 a sectional view of a third step of the lateral overgrowth of a GaN single crystal showing the substrate, mask, windows and mesa-shaped GaN protrusions with slanting side facets and mirror tops projecting from the windows.

FIG. 17 a sectional view of a fourth step of the lateral overgrowth of a GaN single crystal showing the substrate, mask, windows and a flat GaN layer with a mirror top surface made by unifying the individual GaN protrusions projecting from the neighboring windows.

FIG. 21(a) is a sectional view of a substrate and a mask with windows deposited on the substrate for showing a first step of growing a GaN crystal of Embodiment 5.

FIG. 21(b) is a sectional view of the substrate, mask, a GaN buffer layer and a GaN crystal with a rugged surface epitaxially growing on the substrate via the windows for showing a second step of growing a GaN crystal of Embodiment 5.

FIG. 21(c) is a sectional view of an isolated flat-ground, smooth-polished GaN crystal made from the GaN crystal of FIG. 21(b) for showing a third step of growing a GaN crystal of Embodiment 5.

FIG. 21(d) is a sectional view of a GaN seed crystal of FIG. 21(c) and a rugged thick GaN crystal grown on the GaN seed for showing a fourth step of growing a GaN crystal of Embodiment 5.

FIG. 21(e) is a sectional view of isolated flat-ground, smooth-polished GaN crystals made from the GaN crystal of FIG. 21(d) for showing a fifth step of growing a GaN crystal of Embodiment 5.

DETAILED DESCRIPTION OF THE PREFERRED EMBODIMENTS

Figure 1:
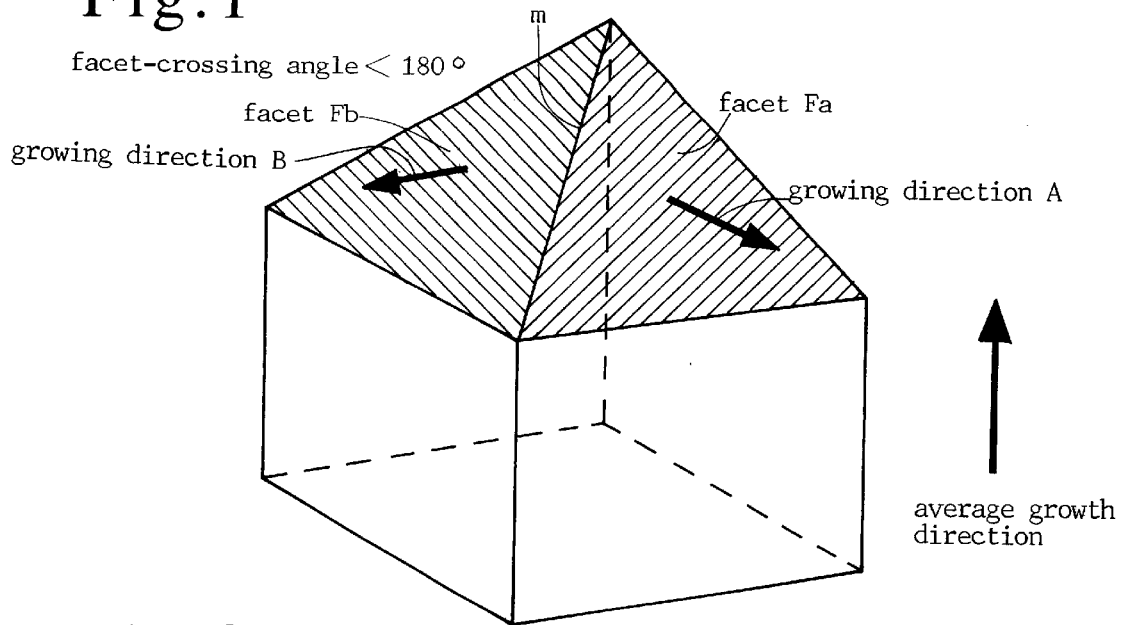
FIG. 1 is a perspective view of an imaginary polygonal convexity having facets which incline to the average growing direction (c-axis) and meet each other at an angle less than 180 degrees along convex boundaries for explaining that the individual facets grow in outer, diverging directions.
Figure 2:
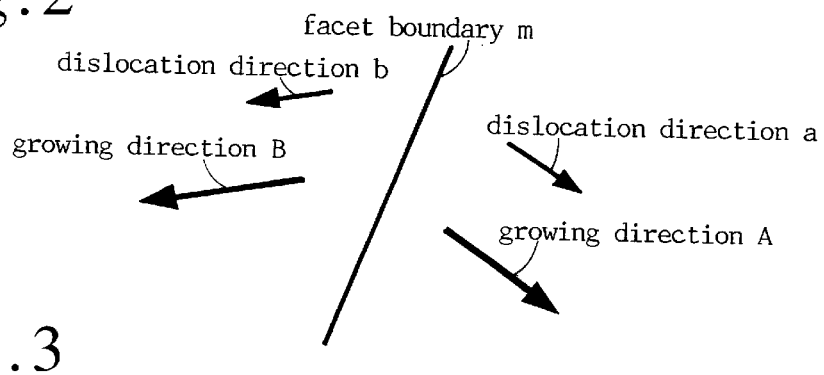
FIG. 2 is an explanatory sketch showing the dislocations (a) and (b) escaping from the boundaries (m) since the growing directions (A) and (B) diverge in the case of the convexity having the facets with a crossing angle of less than 180 degrees.
Figure 3:
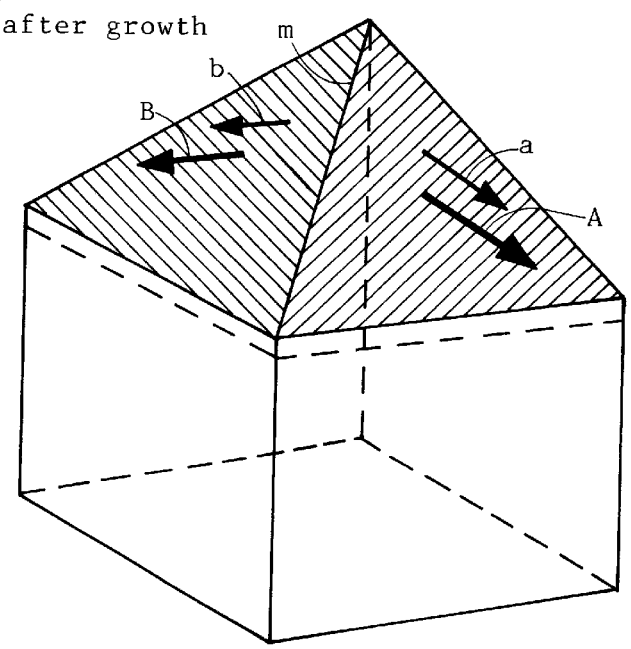
FIG. 3 is a perspective view of an imaginary polygonal convexity having facets which incline to the average growing direction (c-axis) and meet each other at an angle less than 180 degrees along convex boundaries for explaining that the individual facets grow in outer, diverging directions, individual dislocations diverge in the outer directions without being swept along the boundaries.
Figure 4:
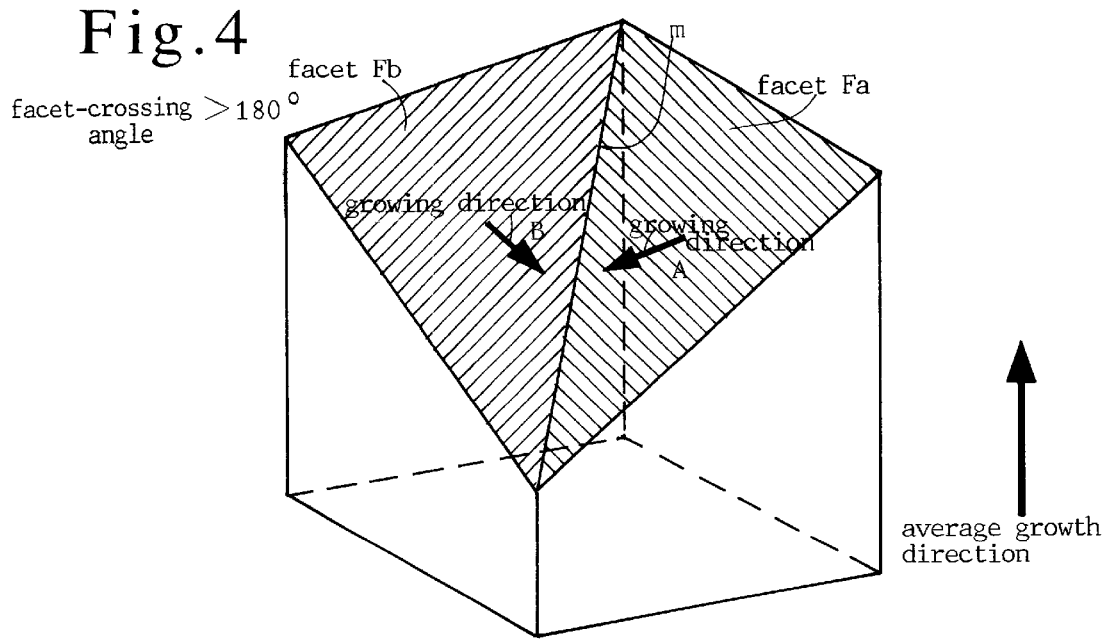
FIG. 4 is a perspective view of an imaginary polygonal concavity having facets which incline to the average growing direction (c-axis) and meet each other at an angle more than 180 degrees along concave boundaries for explaining that the individual facets grow in inner, converging directions.
Figure 5:
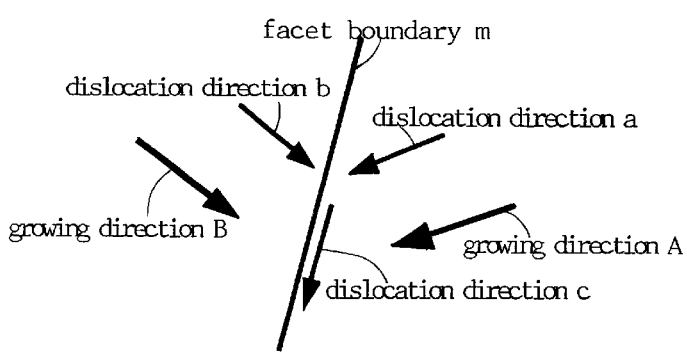
FIG. 5 is an explanatory sketch showing the dislocations (a) and (b) gathering to the boundaries (m) since the growing directions (A) and (B) converge in the case of the concavity having the facets with a crossing angle of more than 180 degrees.
Figure 6:
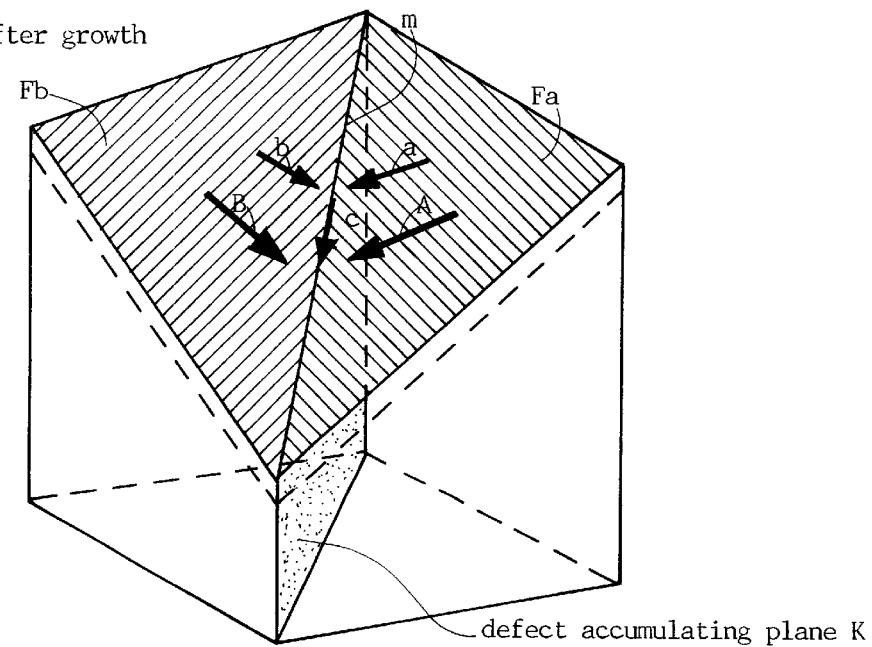
FIG. 6 is a perspective view of an imaginary polygonal concavity having facets which incline to the average growing direction (c-axis) and meet with each other at an angle more than 180 degrees along concave boundaries for explaining that the individual facets grow in inner, converging directions, individual dislocations converge in the inner directions and stay on the bounders.
Figure 7:
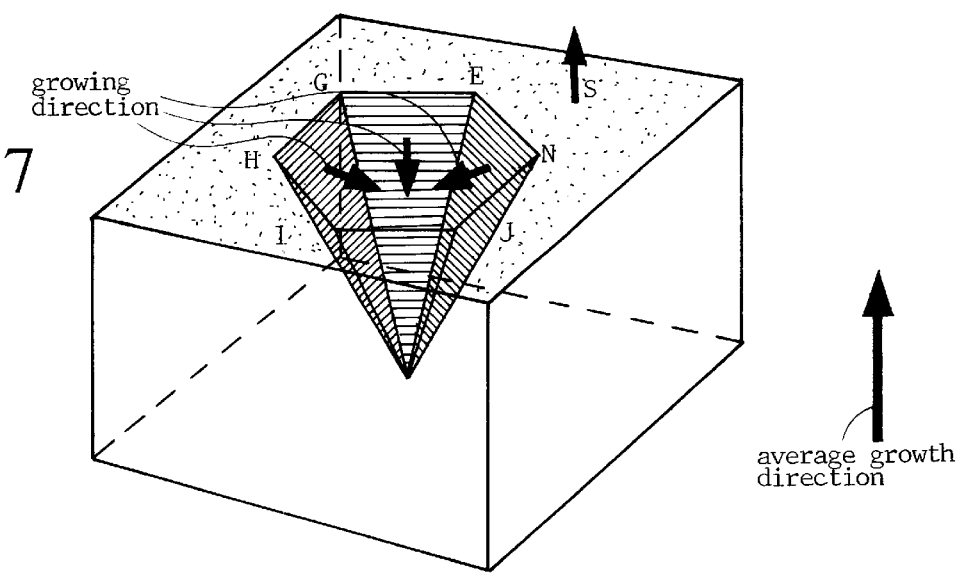
FIG. 7 is a perspective view of a hexagonal pit (concavity) facets appearing on a GaN crystal growing in a facet-maintaining manner in vapor phase according to the teaching of the present invention.
Figure 8:
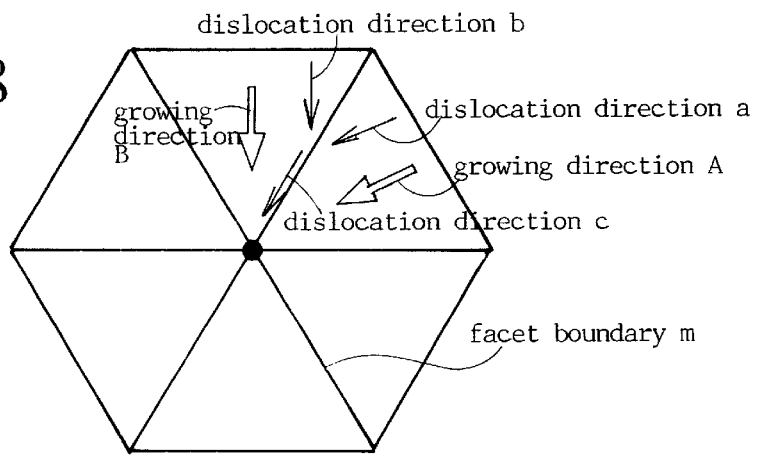
FIG. 8 is a simplified plan view of a hexagonal pit (concavity) with facets appearing on a GaN crystal for showing the individual growing directions A, B, . . . of the facets, dislocation progressing directions a, b, . . . on the facets, collisions of the dislocations with the concave boundaries and a downward accumulation of the dislocations in the boundaries.

The above-mentioned is the method of growing a gallium nitride (GaN) single crystal in accordance with the teaching of the present invention. The GaN single crystal is grown in vapor phase epitaxy maintaining the facet structure in stead of a smooth, mirror surface. The GaN ingot has a rugged surface. Production of GaN wafers requires extra steps. In the first place, mechanical processing gives flatness to the rugged low-dislocation density GaN single crystal. Then, polishing (mechanical or chemical) produces a flat, smooth mirror surface on the GaN single crystal ingot.

The mechanical processing for giving the flatness is, for example, grinding processing. The mechanical processing for giving the flatness is, for example, slicing processing. The production of the low-dislocation GaN wafers of the present invention is now explained from the beginning.

The GaN single crystals are produced by any one of the following vapor phase methods.

Hydride Vapor Phase Epitaxy (HVPE method)

Metallorganic Chemical Vapor Phase Deposition (MOCVD method)

Metallorganic Chloride Vapor Phase Epitaxy (MOC method)

Sublimation Method

All the methods can be applied to realize this invention. Here, an example based on the HVPE method is explained.

The HVPE method makes a GaN crystal by installing a Ga boat containing a Ga melt at a higher level in a hot-wall type reaction furnace, mounting a substrate at a lower level in the reaction furnace, supplying HCl (hydrochloride) gas to the Ga melt for synthesizing GaCl (gallium chloride), transferring the GaCl to the lower level, supplying $NH_3$ (ammonia) gas to the substrate for making $NH_3$ react with the GaCl gas to make GaN and piling the GaN on the substrate.

A suitable substrate for making the GaN crystal is one of sapphire ($Al_2O_3$), silicon carbide (SiC), silicon (Si), spinel ($MgAl_2O_4$), neodymium gallium oxide ($NdGaO_3$), zinc oxide (ZnO), magnesium oxide (MgO), silicon dioxide ($SiO_2$), gallium arsenide (GaAs), gallium phosphide (GaP), gallium nitride (GaN) and aluminum nitride (AlN). Without a mask, GaN can be grown directly on the substrate selected from the above group. It is further effective to coat the substrate with a mask and pile GaN on the masked substrate which will be explained later. The above-cited materials are suitable for the substrate in view of the lattice constant and the thermal expansion.

When GaN is grown in the c-axis direction, a single crystal having six-fold symmetry or three-fold symmetry should be employed as the substrate. Namely, the substrate crystal should be a single crystal belonging to the hexagonal symmetry group or the cubic symmetry group. The (111) plane of the cubic symmetry crystal has three-fold symmetry. The (0001) plane of the hexagonal symmetry crystal has six-fold symmetry. Some of the above-cited materials take more than one symmetry group. The growth temperature and the pressure determine which symmetry group the material takes.

Here, the materials of the hexagonal symmetry or cubic symmetry group should be selected. Hexagonal symmetry single crystals of sapphire, SiC, $SiO_2$, $NdGaO_3$, ZnO, GaN and AlN can be employed as a substrate of the GaN growth. Cubic symmetry (111) single crystals of Si, spinel, MgO, GaAs and GaP can also be adopted as a substrate of the GaN growth. The choice from these materials is adapted to the c-plane growth in the c-axis direction. When the GaN crystal is grown on another plane, another symmetry crystals should be employed. The symmetry of the substrate should coincide with the symmetry of the GaN crystal.

The above-mentioned crystals can be used as a substrate without a mask for growing a GaN crystal thereupon. However, it is more effective to coat the substrate crystal of sapphire(Al$_2$O$_3$), silicon carbide (SiC), silicon (Si), spinel (MgAl$_2$O$_4$), neodymium gallium oxide (NdGaO$_3$), zinc oxide (ZnO), magnesium oxide (MgO), silicon dioxide (SiO$_2$), gallium arsenide (GaAs), gallium phosphide (GaP), gallium nitride (GaN) and aluminum nitride (AlN) with an amorphous or a polycrystal mask having windows. The use of the window-mask is profitable to decrease the dislocations. The growth based upon the window-mask is called a "lateral overgrowth method".

There are two alternatives for coating the crystal with the mask for the lateral overgrowth. One way is to form a mask directly on the substrate. In the case, the substrate surface exposed within the windows should preliminarily be coated with a GaN buffer layer. Another way is to form a thin GaN buffer layer on the substrate and to form a mask on the GaN buffer layer. The second way is preferable for facilitating the following epitaxial GaN growth.

The mask has plenty of apertures (windows) for growing GaN crystal selectively on the substrate surface within the windows. GaN does not grow on the mask. GaN selectively grows on the substrate. The selectivity is important. The mask is coated for inducing the lateral overgrowth of GaN.

The shape of windows also has some alternatives.

① Dotted shape . . . Isolated dots (round dots, square dots) are populated lengthwise and crosswise with a regularity. For growing GaN on the c-plane, three neighboring dots should be positioned at corners of a regular triangle. The direction of the arrays should be parallel with a low index plane. Parameters are the distance between the neighboring dots and the diameter of the dot.

② Indefinite stripe shape . . . Indefinitely long striped mask parts and striped windows are parallely arranged. Parameters are the width of the window, the width of the mask stripe and the pitch of the stripe and window.

③ Definite stripe shape . . . Definite size striped windows are arranged in a regularity. Parameters are the width and the length of the striped window, the width of the mask stripe, the direction of the stripe and the horizontal and vertical pitches of the stripe.

The on-mask growth is more effective for reducing defects from the beginning of the growth than the non-mask growth.

A GaN crystal having plenty of facets is grown on the masked substrate or the non-mask substrate in vapor phase in accordance with the teaching of the present invention. The facet-carrying GaN crystal has a rugged surface. The rugged surface is polished into a smooth, flat mirror surface.

When the substrate crystal is a different material from GaN, the substrate crystal can be maintained to the upper grown GaN crystal. But the foreign substrate crystal can be eliminated from the upper grown GaN crystal by etching or polishing. An isolated GaN crystal is obtained. The bottom surface may be polished as a mirror smooth surface. In this case, a single both-mirror surface wafer can be obtained. The GaN wafer can be used as it is. Otherwise, a thick GaN ingot is grown on the substrate in vapor phase in a similar manner according to the present invention. The thick GaN ingot will be sliced into a plurality of GaN wafers.

Therefore, the present invention makes a plurality of GaN wafers by the steps of preparing a substrate selected from a group of sapphire (Al$_2$O$_3$), SiC, Si, MgAl$_2$O$_4$, NdGaO$_3$, ZnO, MgO, SiO$_2$ GaAs, GaP, GaN and AlN, growing a thick GaN single crystal ingot having a thickness of a plurality of wafers on the substrate in vapor phase, slicing the GaN ingot into a plurality of GaN wafers in the direction vertical to the growth axis.

Otherwise, the present invention makes a plurality of GaN wafers by the steps of preparing a substrate selected from a group of sapphire (Al$_2$O$_3$), SiC, Si, MgAl$_2$O$_4$, NdGaO$_3$, ZnO, MgO, SiO$_2$, GaAs, GaP, GaN and AlN, coating the substrate with an amorphous or polycrystalline mask having apertures (windows), growing a thick GaN single crystal ingot having a thickness of a plurality of wafers on the substrate in vapor phase, slicing the GaN ingot into a plurality of GaN wafers in the direction vertical to the growth axis.

Similar to the case of making a single GaN wafer, the mask layer can be directly deposited on the substrate or indirectly via a GaN buffer layer on the substrate. In general, the latter case (indirect mask) is preferable to the first case (direct mask) for facilitating the growth.

Since a foreign material is used as the substrate, the differences of thermal expansion coefficients are apt to induce cracks in the growing GaN crystal. Since gallium arsenide (GaAs) has a lattice constant and thermal expansion coefficient which are the nearest to GaN, GaAs is one of the most promising substrates. However, GaAs is susceptible to damage caused by the reaction with ammonia NH$_3$ in the atmosphere at high temperature. The mirror-surface growth of GaN requires high temperature. The high temperature for the mirror growth sometimes melts or softens the GaAs substrate partially. GaAs cannot sometimes stand the heat for maintaining the mirror surface growth. Fortunately, the facet-maintaining growth proposed by the present invention admits lower temperature than the mirror surface growth. GaAs can stand the temperature for keeping the facet-driving growth. Thus, GaAs is the most suitable substrate for realizing the present invention.

This invention produces a freestanding single crystal GaN substrate by coating a GaAs (111) substrate with a mask with windows, producing the facet structure on the substrate, growing a GaN single crystal via the windows on the masked GaAs substrate without burying the facets, maintaining the pits having the facets and the assemblies of the pit, reducing dislocations on the GaN crystal by the facets, eliminating the GaAs substrate, obtaining a GaN single crystal wafer and polishing both surfaces of the GaN crystal wafer. The elimination of the GaAs substrate from the GaN grown crystal is done by wet etching by aqua regia.

The GaN single crystal can be adopted as a seed crystal (substrate) for growing another GaN crystal. This invention makes a plurality of freestanding GaN single crystals by making use of the produced GaN as a seed substrate, forming the three dimensional facet structure on the substrate, growing a GaN single crystal without burying the facets, maintaining the pits having the facets and the assemblies of the pit, reducing dislocations on the GaN crystal by the facets, obtaining a GaN single crystal ingot having a large thickness of a plurality of GaN wafers, slicing the ingot into wafers in the direction vertical to the growth axis, polishing both surfaces of the GaN crystal wafers.

The GaN single crystal substrates are polished for making a mirror wafer. The substrate has the properties given by the present invention. The dislocations have been reduced by forming the facet structure, maintaining the rugged surface of the GaN layer without burying the pits or the pit assemblies. Thus the GaN substrates have low dislocation density. The dislocations are accumulated in the defect-accumulating lines (linear defect assemblies). The density of the defect-accumulating lines is less than $10^5$ cm$^{-2}$.

There are two methods of measuring the density of the linear defect assemblies. One is a method which measures the density by making use of the cathode luminescence (CL)

from GaN samples. The cathode luminescence method measures electron luminescence energy by applying a negative bias upon the GaN wafer sample, shooting the GaN sample with electron beams from a positive-biased electron gun, exciting the electrons in the GaN crystal from the stationary state to an excited state, changing the accelerating energy of electrons for varying the set of the initial stationary state and the excited state and measuring the energy distribution of the light (luminescence) emitted by the electrons returning to the initial state. The light is called cathode luminescence since the negative-biased sample (cathode) emits luminescence by the electron beam irradiation. When the acceleration energy is changed, the light (luminescence) energy is also varied. When the electron acceleration energy is equal to the band gap energy between the conduction band and the valence band, the luminescence wavelength is equal to the band gap wavelength. The luminescence from the band gap transition is here observed by setting the acceleration power just at the band gap energy. The luminescence distribution of whole of the sample is detected by scanning the electron beams two-dimensionally on the GaN sample. The band gap luminescence from the sample is different for the pits and for the c-plane growing parts. The pit parts seem to be white. The c-plane growing parts seem to be black on the luminescence image. The linear defect-assemblies (defect-accumulating lines) seem to be a black point in white region which corresponds to the pit region having facets. The dislocation density is given by counting black points in a certain area on the CL image and dividing the number of the black points by the area.

Another method for measuring the linear defect-assemblies is a measurement of the etch pit density (EPD). Since the GaN has been polished into a mirror wafer, no etch pit appears on the mirror surface. The linear defect-assemblies can be observed as etch pits by etching the object GaN single crystal substrate in a hot acid mixture of sulfuric acid and phosphoric acid at 250° C. Then the revealed pits are counted by the microscope observation.

An ordinary single etch pit is a small round concave having a diameter of about several micrometers ($\mu$m). The linear defect-assemblies are observed as a large hexagonal etch pit of about 10 micrometers ($\mu$m) to several tens of micrometers ($\mu$m) unlike the single etch pit. If the large hexagonal pit is counted as one pit, the etch pit density is less than $10^5$ cm$^{-2}$. Except the defect assemblies, ordinary small defects are also observed. Thus, the total of the defect density is less than about $10^6$ cm$^{-2}$ for the GaN single crystal grown by the teaching of the present invention.

[Embodiment 1 (Sapphire Substrate, Non-mask, Grinding Process)]

Figure 18:
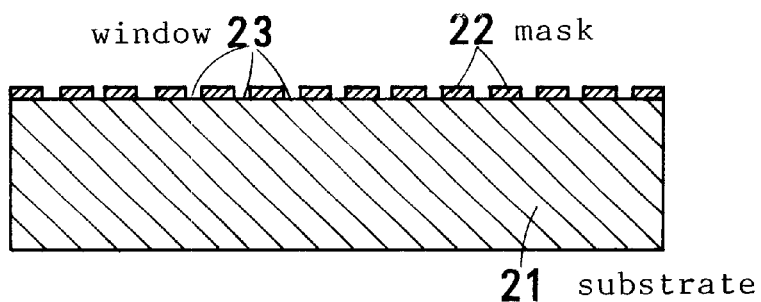
FIG. 18(a) is a sectional view of a substrate and a mask with windows deposited on the substrate for showing a first step of growing a GaN crystal of Embodiment 1.
FIG. 18(b) is a sectional view of the substrate, mask and a GaN crystal with a rugged surface epitaxially growing on the substrate via the windows for showing a second step of growing a GaN crystal of Embodiment 1.
FIG. 18(c) is a sectional view of a flat-ground, smooth-polished GaN crystal with the substrate for showing a third step of growing a GaN crystal of Embodiment 1.
Figure 18:
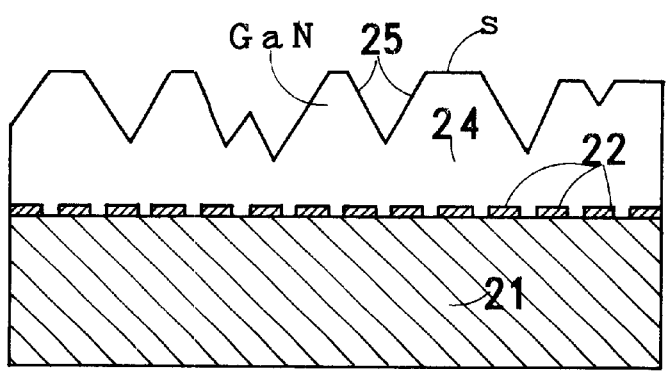
Figure 18:
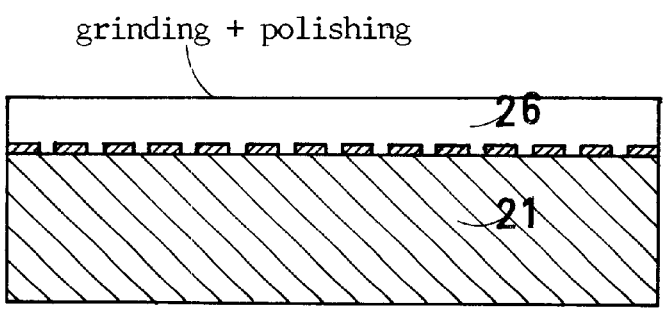

Embodiment 1 is explained by referring to FIG. 18(*a*) to FIG. 18(*c*). A sapphire substrate or GaAs substrate 21 is prepared. Here the case of the sapphire substrate is explained. But the same process can be applied to a GaAs substrate. A mask 22 with windows 23 is formed on the sapphire substrate 21 (FIG. 18(*a*)). The shape of the windows 23 is arbitrary. For example, dotted rounds, dotted squares, definitely long stripes and indefinitely long stripes are available. A GaN 24 is grown on the masked substrate 21 not on the normal condition for making a smooth, mirror surface crystal but on the facet-driving condition. The facet-driving growth makes a rugged surface having many small ridges and tiny valleys built by facets 25 (FIG. 18(*b*)). The surface contains small partial mirror surfaces (s) in the rough top. Then, the rugged surface is ground and polished into a flat, smooth surface. FIG. 18(*c*) shows a polished GaN single crystal 26 still adhering to the substrate 21.

The substrate 21 is a sapphire (0001) single crystal having the c-plane. Preliminarily a GaN/sapphire double-layer is made by coating the sapphire substrate with a 2 $\mu$m thick GaN undercoating layer by the HVPE method. Two different kinds $\alpha$ and $\beta$ of substrates are produced. One ($\beta$) is a masked substrate having a mask of striped windows on the GaN layer. The window stripes of the mask of the sample ($\beta$) are parallel with the orientation of GaN <1$\bar{1}$00>. The width of a window is 4 $\mu$m. The coating part width is also 4 $\mu$m. A period of the window and the mask pattern in the vertical direction is 8 $\mu$m. The material of the mask is silicon dioxide (SiO$_2$). The thickness of the mask is 0.1 $\mu$m. The other ($\alpha$) is a bare, non-mask substrate of the GaN/sapphire double-layer.

The substrate ($\beta$) has a three-layer structure of the mask/GaN/sapphire. The substrate ($\alpha$) has a two-layer structure of the GaN/sapphire. GaN crystals are grown on the substrate ($\beta$) and substrate ($\alpha$) by the HVPE method. The HVPE apparatus making the GaN crystal of the embodiments comprises a reaction furnace with heaters, gas inlets at the top of the furnace, a gas outlet at the bottom of the furnace, a Ga-boat containing a Ga melt installed at a high level in the furnace and a susceptor provided at a low level in the furnace. A Ga metal is supplied to the Ga-boat and a substrate ($\alpha$ or $\beta$) is placed upon the susceptor. The gas outlet communicates with a vacuum pump for exhausting the gas. One gas inlet introduces a mixture of H$_2$ (carrier gas) and HCl (hydrochloride) gas into the furnace. The other gas inlet inhales another mixture of H$_2$ (carrier gas) and NH$_3$ (ammonia) gas into the furnace. The epitaxial growth of GaN in the HVPE apparatus is done by the steps of exhaling gas in the furnace via the gas outlet by the vacuum pump, heating the Ga-boat for melting the Ga metal into a Ga-melt, heating the substrate on the susceptor, supplying (H$_2$+HCl) gas via the first gas inlet just above the Ga boat for inducing a reaction between HCl and the Ga at the atmospheric pressure and for making gallium chloride (GaCl) gas, supplying (H$_2$+NH$_3$) gas above the substrate for inducing another reaction between GaCl and NH$_3$, synthesizing GaN by the reaction, and piling the GaN upon the substrate.

(1. Formation of Buffer Layer)

First, a GaN buffer layer of a 30 nm thickness is made by piling GaN on the masked substrate ($\beta$) or the non-masked substrate ($\alpha$) for about 10 minutes in the HVPE apparatus on the condition of maintaining the substrate on the susceptor at 490° C., keeping the NH$_3$ gas partial pressure at 0.2 atm (20 kPa) and the HCl partial pressure at 2×10$^{-3}$ atm (0.2 kPa). The non-mask substrate ($\alpha$) is entirely covered with the 30 nm thick GaN buffer layer. The masked substrate ($\beta$) has the 30 nm thick GaN buffer layer only on the bare parts within the windows of a 100 nm thick mask. The mask itself is not covered with GaN in the sample ($\beta$).

(2. Formation of Epitaxial Layer)

Second, a epitaxial layer is further deposited upon the GaN buffer layer at a higher temperature of 980° C. to 1050° C. on seven different conditions. Two of the different conditions are applied to the epitaxial growth on the non-mask substrate ($\alpha$). The epitaxial samples grown from the non-mask substrate ($\alpha$) are named Sample A and Sample B. Five of the different conditions are applied to the epitaxial growth on the masked substrate ($\beta$). The epitaxial samples grown from the masked substrate ($\beta$) are named Sample C, Sample D, Sample E, Sample F and Sample G. The conditions of growing Samples A to G are as follows;

○Sample A

| | |
|---|---|
| Substrate | sapphire (non-mask) |
| Growth Temperature | 1050° C. |
| $NH_3$ partial pressure | 0.2 atm (20 kPa) |
| HCl partial pressure | $5 \times 10^{-3}$ atm (0.5 kPa) |
| Growth Time | 8 hours |
| Thickness | 290 μm |

○Sample B

| | |
|---|---|
| Substrate | sapphire (non-mask) |
| Growth Temperature | 1000 ° C. |
| $NH_3$ partial pressure | 0.3 atm (30 kPa) |
| HCl partial pressure | $2 \times 10^{-2}$ atm (2 kPa) |
| Growth Time | 3.5 hours |
| Thickness | 420 μm |

○Sample C

| | |
|---|---|
| Substrate | sapphire (mask) |
| Growth Temperature | 1050° C. |
| $NH_3$ partial pressure | 0.2 atm (20 kPa) |
| HCl partial pressure | $5 \times 10^{-3}$ atm (0.5 kPa) |
| Growth Time | 9 hours |
| Thickness | 270 μm |

○Sample D

| | |
|---|---|
| Substrate | sapphire (mask) |
| Growth Temperature | 1020° C. |
| $NH_3$ partial pressure | 0.2 atm (20 kPa) |
| HCl partial pressure | $1 \times 10^{-2}$ atm (1 kPa) |
| Growth Time | 6 hours |
| Thickness | 330 μm |

○Sample E

| | |
|---|---|
| Substrate | sapphire (mask) |
| Growth Temperature | 1000° C. |
| $NH_3$ partial pressure | 0.3 atm (30 kPa) |
| HCl partial pressure | $2 \times 10^{-2}$ atm (2 kPa) |
| Growth Time | 3.5 hours |
| Thickness | 400 μm |

○Sample F

| | |
|---|---|
| Substrate | sapphire (mask) |
| Growth Temperature | 1000° C. |
| $NH_3$ partial pressure | 0.4 atm (40 kPa) |
| HCl partial pressure | $3 \times 10^{-2}$ atm (3 kPa) |
| Growth Time | 3 hours |
| Thickness | 465 μm |

○Sample G

| | |
|---|---|
| Substrate | sapphire (mask) |
| Growth Temperature | 980° C. |
| $NH_3$ partial pressure | 0.4 atm (40 kPa) |
| HCl partial pressure | $4 \times 10^{-2}$ atm (4 kPa) |
| Growth Time | 2.5 hours |
| Thickness | 440 μm |

Sample A and Sample C have a similar growth condition except the growth time. Sample B and Sample E have the same growing conditions and the same growing time. But the thickness of the grown crystals is different between Sample B and Sample E.

The temperature is an important factor. Samples A, C and D make the crystals at higher temperatures of 1050° C. or 1020° C. Samples B, E, F and G produce the crystals at lower temperatures of less than 1000° C.

The $NH_3$ partial pressure exercises an influence upon the formation of the GaN crystal. Samples A, C and D keep the $NH_3$ partial pressure at 0.2 atm (20 kPa). Samples B and E maintain the $NH_3$ partial pressure at 0.3 atm (30 kPa). Sample F and G employ a higher $NH_3$ pressure of 0.4 atm (40 kPa).

The HCl partial pressure is another important factor. Samples A, C and D keep the HCl partial pressure below $10^{-2}$ atm (1 kPa). Samples B, E, F and G keep the HCl partial pressure above $2 \times 10^{-2}$ atm (2 kPa).

The thickness of the growing film crystal is thought to be proportional to the growing time as long as the same condition is maintained. The growing rate per hour is especially low for Sample C (30 μm/h) and Sample A (36 μm/h). The growing rate is low for Sample D (55 μm/h). These samples have growing speeds of less than 100 μm/h. Sample B (120 μm/h), Sample E (114 μm/h), Sample F(155 μm/h) and Sample G (176 μm/h) have higher growing speeds of more than 100 μm/h.

The group of higher growing speeds, that is, Samples (G, F, B and E), have common features of higher $NH_3$ partial pressure, higher HCl partial pressure and a lower growth temperature in general. On the contrary, lower $NH_3$ partial pressure, lower HCl partial pressure and a higher growing temperature give lower growing speeds (Samples C, A and D).

The surfaces of the samples are observed by a microscope. The facet-rate F/W which is a quotient of the facet region area divided by the total area is calculated from the data obtained by image-analyzing the microscope photographs of the surfaces.

The surfaces of the grown crystals depend upon the growth conditions. Some samples (A, C) have flat, smooth mirror surfaces. Other samples (B, E, F, G) have rugged surfaces covered with plenty of facets and pits. Mirror-surface grown Samples A and C have a flat c-plane surface fully immune from facets. Nearly mirror-surface grown Sample D includes about 10% facet regions.

Other samples B, E, F and G are covered with three-dimensional facet structure constructing the pits. Most of the facets have $\{11\bar{2}2\}$ planes in the Samples B, E, F and G. In the case, the pits are hexagonal conical concavities. Sometimes $\{1\bar{1}01\}$ planes accompany $\{11\bar{2}2\}$ planes in the facet structure. In the case, the pits are twelve folding conical concavities. The even parts are mainly the c-planes. However, other low slanting angle planes appear as even parts.

After the microscope surface observation, the GaN surfaces of all the samples are ground. Then, the surfaces are finished by a polishing machine till the roughness attains to less than Rmax1.5 nm. The samples are shaped as mirror wafers.

The properties are examined with regard to the samples. The surfaces are flat, mirror surfaces without concavities or convexes. Measuring of the EPD requires revealing the etch pits on the surfaces. The etch pits are revealed by dipping the sample wafers into a heated mixture of sulfuric acid and phosphoric acid at 250° C. and etched by the hot etchant. The number of the etch pit revealed by the etching is counted by the microscope observation. The facet-region ratio F/W is calculated from the data taken by the image-analysis which discriminates between the facet-parts and the c-axis growing parts. The mentioned small angle slanting flat parts are included in the c-axis growing parts by the image-analysis. Then, the F/W is not exactly equal to the rate of the facet parts to the c-axis growing parts. The F/W is rather the rate of the pits parts to the total area. The following are the surface state, the F/W rate and the EPD of all the sample.

○ Sample A

| | |
|---|---|
| Surface state: | Smooth mirror surface. No surface pit is observed. |
| Facet region ratio F/W: | 0% |
| EPD: | $1 \times 10^8$ cm$^{-2}$ |

-continued

○ Sample B

Surface state: Mixture of facet regions and smooth mirror.
parts. Many facets are observed as surface pits.
Facet region ratio F/W: about 50%
EPD: $3 \times 10^5$ cm$^{-2}$ ○ Sample C Surface state: Smooth mirror surface.
No surface pit is observed.
Facet region ratio F/W: 0%
EPD: $3 \times 10^7$ cm$^{-2}$ ○ Sample D Surface state: Nearly smooth mirror surface.
Some surface pits are observed.
Facet region ratio F/W: about 10%
EPD: $8 \times 10^5$ cm$^{-2}$ ○ Sample E Surface state: Mixture of facet regions and smooth mirror.
parts. Many facets are observed as surface pits.
Facet region ratio F/W: about 40%
EPD: $5 \times 10^4$ cm$^{-2}$ ○ Sample F Surface state: Facet-dominating surface.
Partially, c-plane surface parts are observed.
Facet region ratio F/W: about 80%
EPD: $2 \times 10^4$ cm$^{-2}$ ○ Sample G Surface state: Facet-occupying surface.
Pits and other facets are observed.
Facet region ratio F/W: about 100%
EPD: $1 \times 10^4$ cm$^{-2}$ Samples A and C are not included in the category of the present invention, since Sample A and Sample C are immune from facets. Samples B, D, E, F and G are included in the scope of the present invention, because the facet growth accompanies these samples. The samples are favored with small EPD. All attempts have failed in reducing the EPD below $10^7$ cm$^{-2}$. The purpose of the invention is to reduce the EPD to a low value of less than $10^6$ cm$^{10-2}$. These samples, five embodiments of the present invention, satisfy the requirement of the low EPD of less than $10^6$ cm$^{-2}$. Sample D ($8 \times 10^5$ cm$^{-2}$) and Sample B($3 \times 10^5$ cm$^{-2}$) pass the examination. Samples E, F and G are exceptionally low EPD density GaN single crystals having far lower EPD of an order of $10^4$ cm$^{-2}$ which is still less than the critical value $10^6$ cm$^{-2}$.

Both Sample A and Sample B grow without the mask. Sample A does not belong to the present invention. Sample B belongs to this invention. Sample A is a mirror-surface GaN crystal grown on the conditions of a higher temperature, lower NH$_3$ partial pressure and lower HCl partial pressure. The EPD of Sample A is $10^8$ cm$^{-2}$ which is higher than the prior EPD level of $10^7$ cm$^{-2}$.

Sample B, an embodiment, is a facet-driven crystal grown on the conditions of a lower temperature, higher NH$_3$ partial pressure and higher HCl partial pressure. The facet-region rate is about 50% for Sample B. The EPD is $3 \times 10^5$ cm$^{-2}$ which satisfies the requirement (less than $10^6$ cm$^{-2}$) of the present invention. Both Samples A and B grow without mask. Thus, the ground of reducing the EPD to about 1/300 in Sample B is not the use of mask (lateral overgrowth). The lateral overgrowth does not encourage such a large reduction of the EPD.

It is clear that the large reduction of the EPD originates from the facet-driven growth. The facet-maintaining growth decreases the EPD by removing dislocations on the facets. however, the fact is not so simple that the EPD is zero on the facets but is $10^8$ cm$^{-2}$ on the mirror parts. If so, the EPD would be determined by the proportion of the mirror-region area and the facet-region area. The facet-region area is about 50% of the entire surface in Sample B. Then, the EPD in Sample B would be $5 \times 10^7$ cm$^{-2}$ which is half of Sample A. But the EPD of Sample B is not $5 \times 10^7$ cm$^{-2}$ but $3 \times 10^5$ cm$^{-2}$. The mirror-surface parts of Sample B should have also lower EPD than $10^8$ cm$^{-2}$. Some change should happen beneath the mirror-surface parts.

Sample A (non-mask) and Sample C (mask) have smooth mirror surfaces without facets. The mirror-surface growth of Sample A (non-mask) and Sample C (mask) is done on the conditions of a higher temperature, lower NH$_3$ partial pressure, lower HCl partial pressure and lower growing speed. Comparison non-mask Sample A with masked Sample C will clarify the influence of the mask. The EPD is $10^8$ cm$^{-2}$ for Sample A and $3 \times 1$ cm$^2$ for Sample C. Both samples cannot be less than the conventional record ($10^7$ cm$^{-2}$). The EPD of Sample C has about 0.3 of the EPD of Sample A. The reduction of the EPD results from the growth via the windows. The mask has a function of reducing the EPD. However, the merit of the mask is restricted to reduce the EPD to about one third. The facet-growth is far more powerful for reducing the EPD than the mask. Such a drastic EPD reduction does not result from the lateral overgrowth.

Sample D also clarifies the effect of the facets for reducing the EPD. Sample D has a smooth part of 90% and a rugged facet part of 10%. Despite the small rate (10%) of the facet regions, the EPD is reduced to $8 \times 10^5$ cm$^{-2}$ which is far less than the prior record $10^7$ cm$^{-2}$ The EPD of Sample D is one fortieth (1/40) of the EPD of prior art Sample C ($3 \times 10^7$ cm$^2$). If the facet regions (10%) had 0 cm$^{-2}$ EPD and the mirror surface regions (90%) had $3 \times 10^7$ cm$^{-2}$ EPD, the average EPD should be $2.7 \times 10^7$ cm$^{-2}$. But the measured EPD of Sample D is only $8 \times 10^5$ cm$^{-2}$. Though the facet rate is only 0.1 on the final surface, the facet hysteresis also reduces the EPD of the mirror-surface growing regions. Sample D shows clearly the role. of the facet hysteresis. The facet hysteresis has an influence upon the mirror-surface regions. Such a surprising reduction cannot be understood only by the observation of the final surface.

Samples E, F and G have quite small EPD of an order of $10^4$ cm$^{-2}$ which has no antecedent. In particular, Sample G of 100% facet rate has the least EPD of $1 \times 10^4$ cm$^{-2}$. Sample E which reveals the highest EPD of $5 \times 10^4$ cm$^{-2}$ among the three has the lowest facet rate of 40%. These results show the fact that even 10% of the facet rate has a great effect of reducing the EPD and the higher facet rate reduces more completely the EPD.

The vertical sections of the facet-grown samples are observed by a transmission electron microscope (TEM). It is observed that there are linear defect assemblies at the centers of the facet pits vertical to the surface in all the facet-grown samples. These are linear defects (defect assembly lines) extending along the c-axis.

Besides the linear defect assemblies, planar defect assemblies are observed. The planar defect assemblies sometimes expand from the central defect lines in radial directions with about a 60 degree crossing angle. The planar defects (defect assembly planes) have the orientations denoted by {11$\bar{2}$0}. It was confirmed that the planar defect assemblies are small angle grain boundaries.

The observations of all the facet-coated Samples (B, D, E, F, G) by the TEM are similar. Dislocations are observed only at the centers of the facet pits. However, no dislocation is observed at any parts except the centers of the facet pits within the scope of the TEM.

Embodiment 1 of the present invention enables Samples (B, D, E, F, G) to reduce the EPD level down to an order of $10^4$ cm$^{-2}$. There is still a probability of further decreasing the EPD by optimizing the growth conditions. If laser diodes (LDs) are produced upon the GaN wafer of $10^4$ cm$^{-2}$ EPD, the low EPD may give a sufficiently long lifetime to the LDs. The complex GaN crystal unified with the substrate can be utilized as a GaN wafer. An isolated GaN crystal can be made by getting rid of the sapphire substrate of thick Sample F and Sample G by grinding. The isolated GaN wafers without substrate are more convenient for making devices on them.

[Embodiment 2 (GaAs Substrate; Long Ingot; Slicing Process)]

Figure 9:
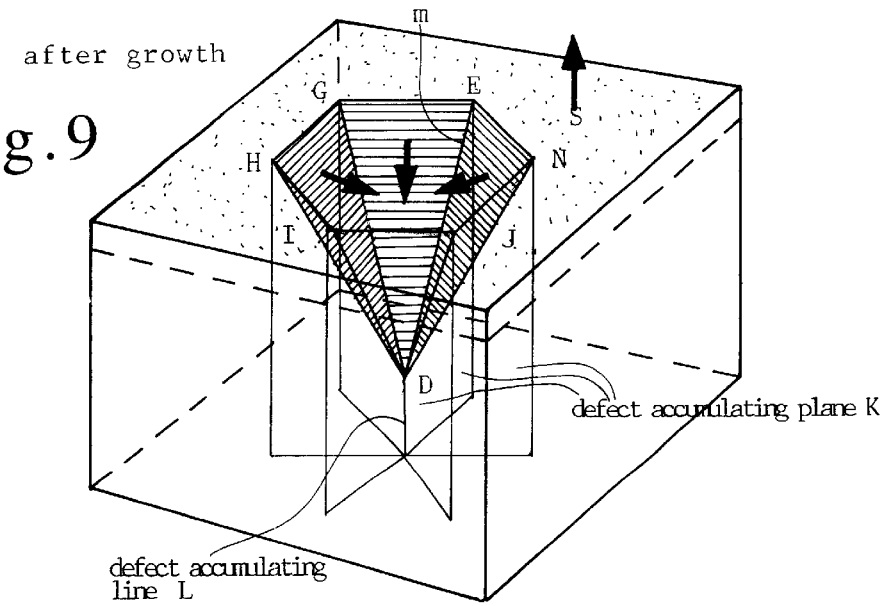
FIG. 9 is a perspective view of a hexagonal pit (concavity) EGHIJN-D with facets appearing on a GaN crystal for showing the individual growing directions of the facets, dislocation progressing directions on the facets, collisions of the dislocations with the concave boundaries, a downward accumulation of the dislocations in the boundaries, generation of the defect-accumulating planes K just below the boundaries and a defect-accumulating line L along the axis of the pit.
Figure 10:
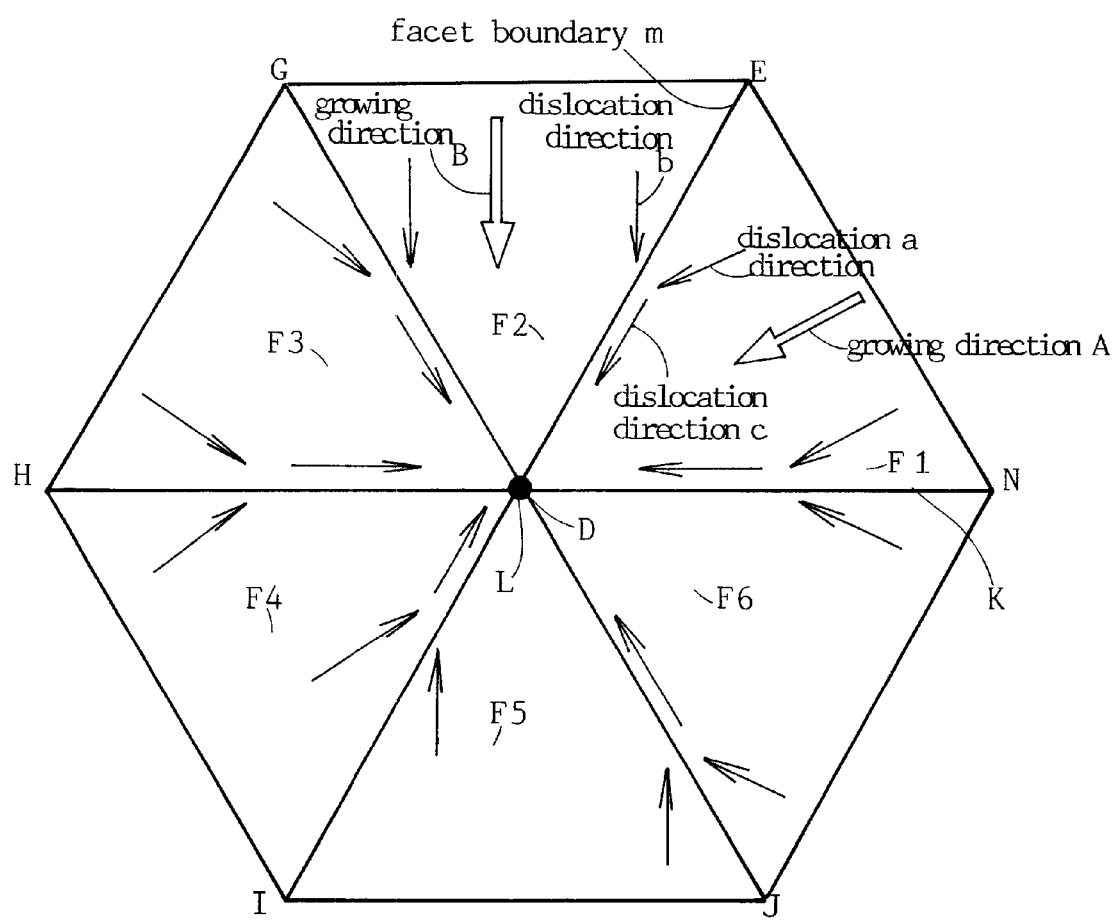
FIG. 10 is a plan view of a hexagonal pit (concavity) EGHIJN-D with facets F1, F2, F3, F4, F5 and F6 appearing on a GaN crystal for showing the individual growing directions A, B, of the facets, dislocation progressing directions a, b, . . . on the facets, collisions of the dislocations with the concave boundaries, a downward accumulation of dislocations in the boundaries, generation of the defect-accumulating planes K just below the boundaries and a defect-accumulating line (L) below the bottom multi-defect point (D) along an extension of the axis of the pit.
Figure 11:
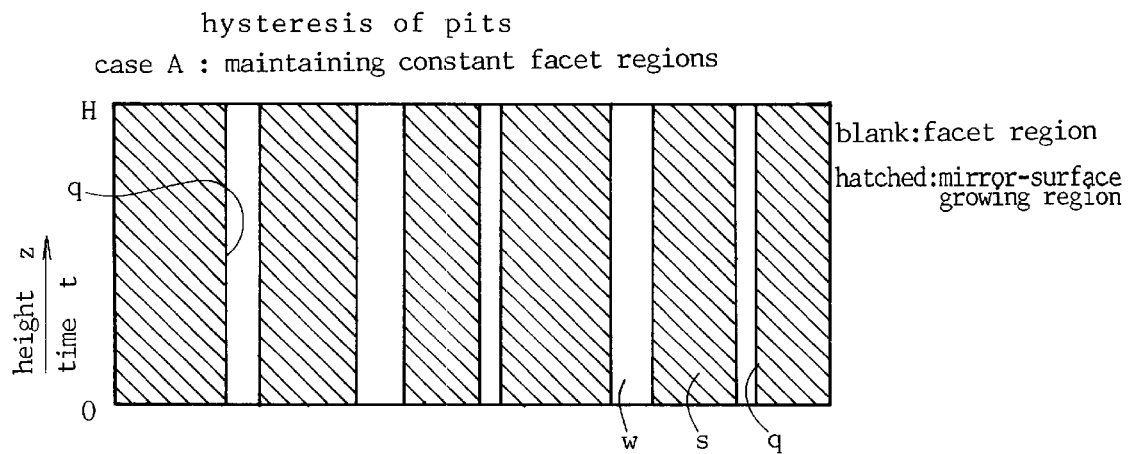
FIG. 11 is a vertically sectioned view of a GaN crystal obtained by maintaining the facet-driven growth regions and the mirror-surface growth regions in a definite distribution on all heights. Blank parts are facet-driven growing regions (w) and the hatched parts are mirror-surface (c-plane) growing regions (s). Vertical lines (q) are interfaces between the facet growing regions and the mirror-surface growing regions. An upward arrow denotes the height and the growth time. The interfaces (q) are straight lines.
Figure 12:
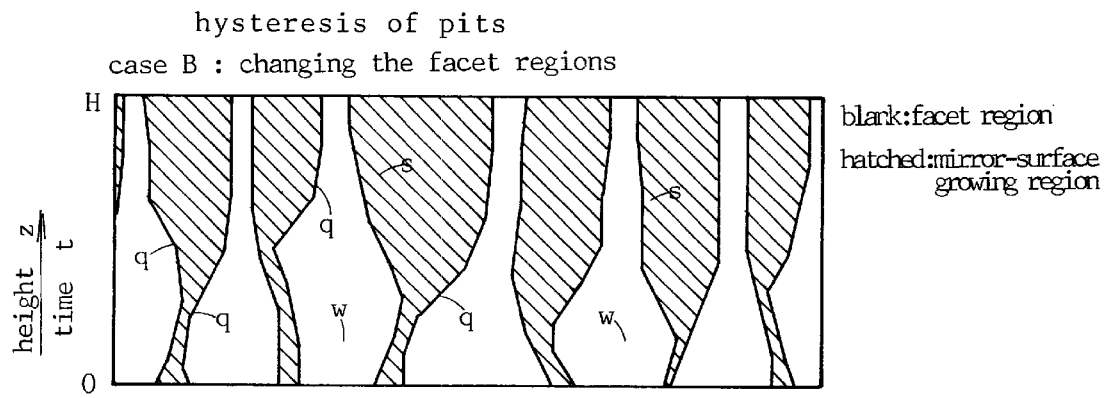
FIG. 12 is a vertically sectioned view of a GaN crystal obtained by changing continually the distribution of the facet-driven growth regions and the mirror-surface growth regions on all heights. Blank parts are facet-driven growing regions (w) and the hatched parts are mirror-surface (c-plane) growing regions (s). Vertical lines (q) are interfaces between the facet growing regions and the mirror-surface growing regions. An upward arrow denotes the height and the growth time. The interfaces (q) are continual curved lines.
Figure 13:
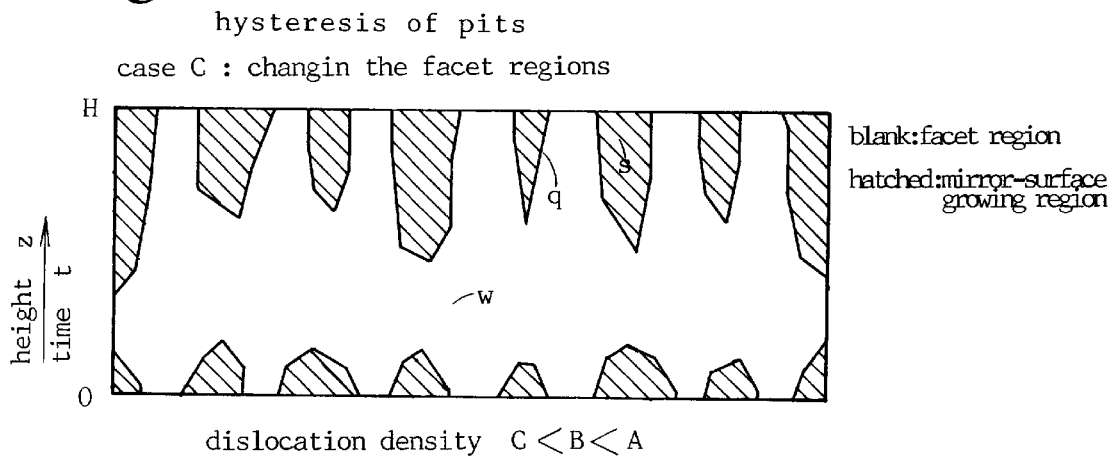
FIG. 13 is a vertically sectioned view of a GaN crystal obtained by changing continually the distribution of the facet-driven growth regions and the mirror-surface growth regions on all heights. At a level, all the surface is occupied by the facet-driven region. Blank parts are facet-driven growing regions (w) and the hatched parts are mirror-surface (c-plane) growing regions (s). Vertical lines (q) are interfaces between the facet growing regions and the mirror-surface growing regions. An upward arrow denotes the height and the growth time. The interfaces (q) disappear at some levels.
Figure 19:
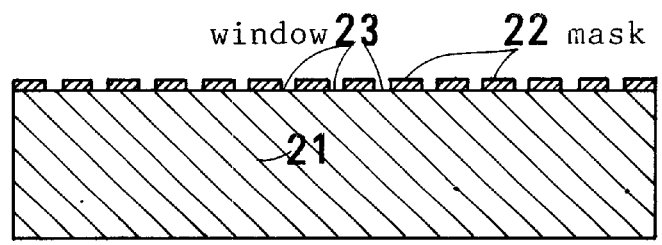
FIG. 19(a) is a sectional view of a substrate and a mask with windows deposited on the substrate for showing a first step of growing a GaN crystal of Embodiment 2.
FIG. 19(b) is a sectional view of the substrate, mask, a GaN buffer layer and a GaN crystal with a rugged surface epitaxially growing on the substrate via the windows for showing a second step of growing a GaN crystal of Embodiment 2.
FIG. 19(c) is a sectional view of an isolated flat-ground, smooth-polished GaN crystal for showing a third step of growing a GaN crystal of Embodiment 2.
Figure 19:
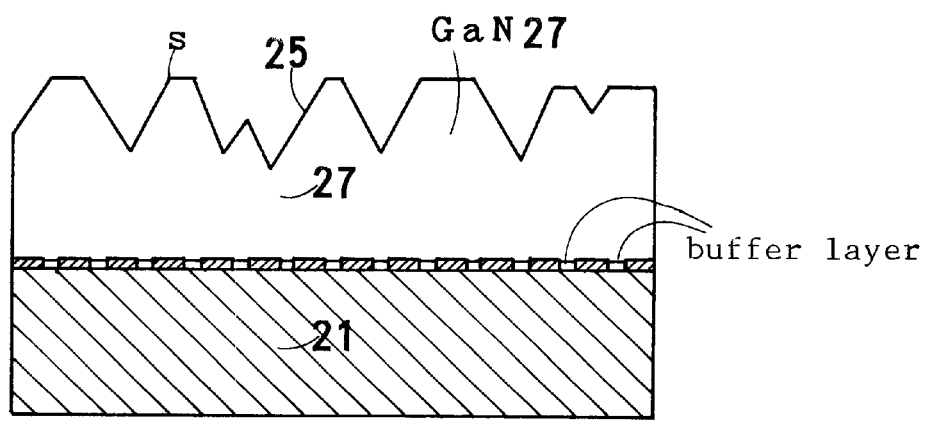
Figure 19:
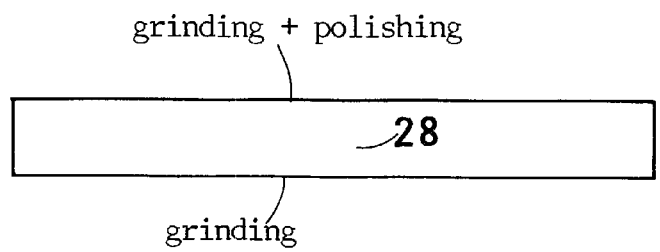

FIGS. 19(a) to (c) show Embodiment 2. A mask 22 with windows 23 is deposited on a substrate 21. The substrate 21 is, for example, a sapphire single crystal or GaAs single crystal substrate. Like some samples of Embodiment 1, the substrate surface is coated with the mask having the windows for the lateral overgrowth (FIG. 9(a)). A GaN crystal 27 is grown on the substrate 21 via the windows 23 over the mask 22 on the condition avoiding the mirror-surface growth but favoring the facet-growth. Plenty of facets 25 appear on the rugged surface of the grown GaN crystal. The surface has many concavities and convexities. Mirror parts (s) also appear between the neighboring pits. Then, an isolated freestanding GaN crystal 27 is obtained by eliminating the substrate. A GaN mirror wafer 28 is produced by grinding and polishing the rugged top surface and the bottom surface (FIG. 19(c)).

Embodiment 1 produces only a single GaN wafer from the process upon the sapphire substrate. Embodiment 2 aims at making a plurality of wafers at a stroke by growing a tall GaN ingot. The purpose of Embodiment 2 is to investigate the differences of the EPD owing to the difference of the height in the tall ingot. Now, a GaAs wafer is used for the substrate instead of a sapphire substrate.

Embodiment 2 employs a Ga-face ((111)a-face) of a two inch GaAs (111) wafer as a substrate. A plasma CVD method coats the (111) GaAs wafer with a silicon dioxide (SiO$_2$) film of a 0.1 μm thickness for preparing a mask. Windows are perforated on the mask by photolithography.

The windows have some options of the shape, e.g., dotted triangles, dotted rounds, dotted squares or stripes. Here, dotted rounds (or square) of a 2μm diameter are arranged in a periodic pattern of repeating triangles. A series of dot windows are aligned on a straight line at a 4 μm period in the <11$\bar{2}$> orientation of the GaAs substrate. Another series of the dot windows are aligned on a parallel straight line at the same period which is vertically distanced by 3.5 μm from the former dot series. The neighboring lines have the dot windows with the same period in the same direction. But the dot windows belonging the neighboring lines deviate by half (2 μm) a period in the <11$\bar{2}$> direction of GaAs. Namely, every set of the most nearest three dot windows forms an equilateral triangle of a 4 μm long side. Thus, a GaAs substrate with a window-carrying mask is prepared.

A GaN buffer layer and a GaN thick epitaxy-layer are grown on the GaAs substrate covered with the dot-window mask by the HVPE method. Like Embodiment 1, a Ga-boat containing a Ga metal is installed in an upper space in an HVPE reaction furnace and the GaAs substrate is put on a susceptor at a lower space of the furnace. A HCl gas (HCl+H$_2$) is introduced via a top gas inlet to the heated Ga-metal at 800° C. GaCl gas is synthesized. An NH$_3$ gas (NH$_3$+H$_2$) is introduced via another top gas inlet to a space above the substrate. GaCl and NH$_3$ synthesize GaN. The GaN is piled on the substrate on the susceptor. Embodiment grows a tall GaN single crystal ingot for producing a plurality of wafers from the ingot. The production of the tall ingot of Embodiment 2 requires longer growth time than Embodiment 1. The HVPE apparatus for carrying out Embodiment 2 is another apparatus suitable for long time operation which is different from the apparatus for Embodiment 1.

(Formation of Buffer Layer)

A GaN buffer layer of a 80 nm thickness is made by keeping the GaN substrate 500° C., supplying NH$_3$ gas at a partial pressure of 0.2 atm (20 kPa), supplying HCl gas at a partial pressure of $2\times10^{-3}$ atm (0.2 kPa) and piling a GaN film for 30 minutes (0.5 hour). About 80 nm thick GaN buffer layer parts are piled on the bare substrate within the windows. GaN is not piled on the mask. Since the mask has a 100 nm thickness, the GaN buffer layer is enclosed within the windows. Carrier gas for NH$_3$ and HCl is H$_2$.

(Formation of Epi-layer)

A GaN epi-layer is further grown on the buffer layer by maintaining the GaAs substrate at about 1000° C., supplying NH$_3$ gas at a partial pressure of 0.4 atm (40 kPa), supplying HCl gas at a partial pressure of $3\times10^{-2}$ atm (3 kPa) and piling a facet-carrying GaN crystal for about 100 hours.

The 100 hour epitaxial growth produces an about 25 mm long GaN single crystal ingot. The GaAs substrate still accompanies the GaN ingot at the bottom. The top surface of the GaN ingot is not a two-dimensional flat mirror surface but a rugged surface with high density facets. Flat, mirror c-plane parts are only 10% of the total surface. 90% of the surface of the ingot is occupied by the facets (F/W=0.9). Plenty of hexagonal pits with the facets {11$\bar{2}$2} are observed.

The long GaN ingot is cut by a slicer into thin as-cut wafers. The bottom part (substrate side) with an about 2 mm thickness and the top part with an about 3 mm thickness are abandoned. The as-cut wafers are ground and polished into 20 mirror wafers of a 2 inch diameter and of a 350 μm thickness.

Although the GaN wafers are sliced from the same ingot, the EPD of the wafers are different according to the height of the wafer in the ingot. Then, three typical sample wafers H, I and J are selected from the 20 GaN wafers. Sample H is the nearest to the bottom (substrate side). Sample I is a middle one. Sample J is the nearest to the top (surface side). The EPD and the surface state are examined by etching, microscope observation and image-processing.

Sample H EPD: $8\times10^3$ cm$^{-2}$

Sample I EPD: $6\times10^3$ cm$^{-2}$

Sample J EPD: $5\times10^3$ cm$^{-2}$

Extremely small EPD is obtained for the samples. Compared with the prior record $10^7$ cm$^{-2}$, the EPD data of Embodiment 2 are very small. Embodiment 2 shows smaller EPD than Embodiment 1 ($10^4$ cm$^{-2}$). In the three samples, Sample H near the bottom shows the largest EPD ($8\times10^3$ cm$^{-2}$) and Sample J near the top has lowest EPD ($5\times10^3$ cm$^2$). Namely the EPD seems to decrease as the growth progresses. Like Sample F of Embodiment 1, Embodiment 2 takes the facet-preference condition of higher NH$_3$ partial pressure (0.4 atm (40 kPa)), higher HCl partial pressure ($3\times10^{-2}$ atm (3 kPa)) and low temperature (1000° C.).

The polished samples are observed by an electron microscope. The etch pits are hexagonal conical concavities of several micrometers to several tens of micrometers in diameter. The cathode luminescence examination shows that the centers of the superficial pits mainly coincide with the centers of the growing pits built by the facets in the vertical direction. Large pits, in particular, have the centers coinciding with the centers of the growing pits extending just below.

The samples are sliced into thin film. The defects are investigated in the vertical direction by the TEM observation. Linear defect assemblies vertical to the surface are seen at the centers of the growing pits comprising facets which are the centers of the etch pits. Planar defect assemblies containing the linear defect assemblies are observed. Sometimes the planar defect assemblies meet with each other at the linear defect assemblies at a crossing angle of 60 degrees. A plurality of dislocations are observed at the centers of the pits. However, few dislocations exist at the other parts except the centers of the pits. The cathode luminescence shows the existence of deformed pits having round walls deviating from an exact hexagon. However, the effect of decreasing dislocations is equivalent to the exact hexagonal concave pits.

Such a low dislocation density GaN single crystal is quite new. There is a probability of producing long lifetime GaN type LDs (laser diodes) on the low dislocation density GaN substrates.

[Embodiment 3 (Sapphire Substrate; Tall Ingot; Slicing Process)]

Figure 20:
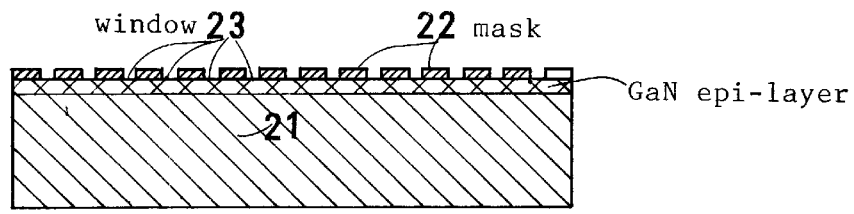
FIG. 20(a) is a sectional view of a substrate, a thin GaN epi-layer and a mask with windows deposited on the substrate for showing a first step of growing a GaN crystal of embodiment 3 and 4.
FIG. 20(b) is a sectional view of the substrate, mask, thin GaN epi-layer and a thick GaN crystal with a rugged surface epitaxially growing on the substrate via the windows for showing a second step of growing a GaN crystal of Embodiment 3 and 4.
FIG. 20(c) is a sectional view of isolated flat-ground, smooth-polished GaN crystals for showing a third step of growing a GaN crystal of Embodiment 3 and 4.
Figure 20:
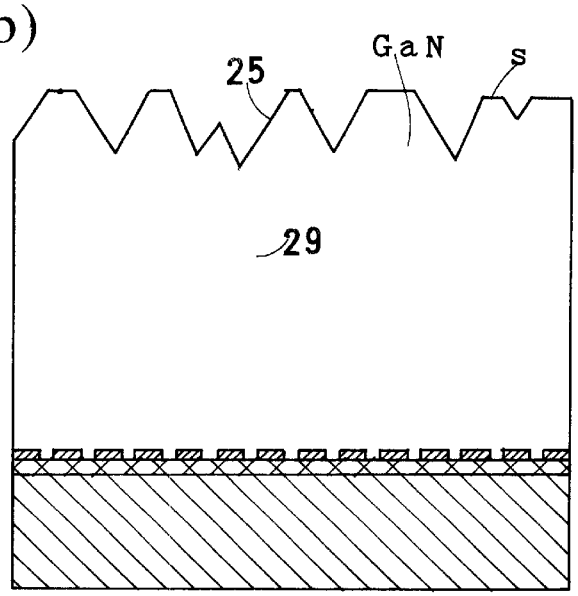
Figure 20:
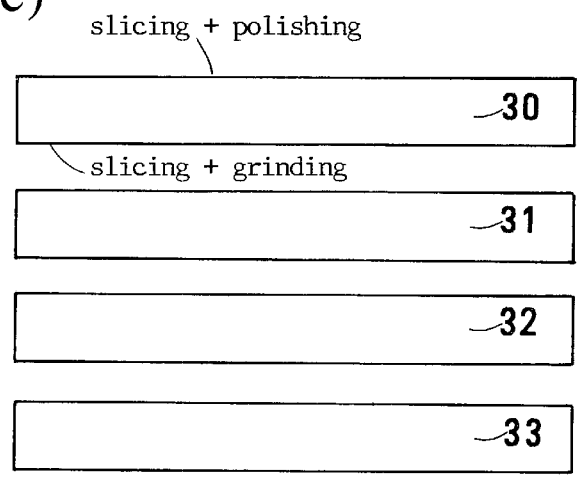

Embodiment 3 is explained by referring to FIG. 20($a$) to FIG. 20($c$). A substrate 21 is sapphire in Embodiment 3. The preferable orientation of the substrate has been already mentioned. The substrate 21 is coated with a mask 22 with windows 23. The shape of the windows are arbitrary, e.g., stripe windows or dotted windows. A thick GaN single crystal 29 is grown over the mask 22 by a long time growth on the condition which suppresses the mirror-surface growth but maintains the facet-driven growth. In FIG. 20($b$), the GaN ingot 29 has a rough, rugged surface with many concavities and convexities. The rugged surface includes small mirror parts (s). The long GaN crystal ingot 29 is sliced into a plurality of thin GaN as-cut wafers in parallel planes vertical to the growth axis. The as-cut wafers are treated with the grinding process and the polishing process and mirror wafer 30, 31, 32, 33, . . . are formed as shown in FIG. 20($c$).

Embodiment 2 has made 20 GaN wafers by slicing the long GaN ingot which is grown on the GaAs substrate. Embodiment 3 aims to produce a plurality of GaN wafers by slicing a long GaN ingot which is grown on a sapphire substrate. The substrate is a 0.4 mm thick sapphire single crystal. Preliminarily, the sapphire substrate is coated with about a 1 $\mu$m thick GaN epi-layer.

The GaN/sapphire substrate is coated with a mask of a 0.1 $\mu$m thickness. The material of the mask is $SiO_2$. The shape of the windows are round dots. The size or the period of the round dot windows should be determined arbitrarily. The direction of the arrangement of the mask windows is determined by referring to the orientation of the precoating GaN epi-layer.

The dot window, e.g., round or square, has an about 2 $\mu$m diameter. A series of windows is aligned at a 4 $\mu$m period in the <1$\bar{1}$00> direction of the GaN layer. Another series of windows is aligned parallely at the same period. The second series is distanced from the former series by 3.5 $\mu$m in the vertical direction. The second series deviates by half period in the longitudinal direction.

Then, the set of dot lines is repeated in the <11$\bar{2}$0> direction. Three nearest neighboring windows form an equilateral triangle of a 4 $\mu$m side. Since the preliminary GaN is deposited upon the sapphire substrate, a buffer layer is not deposited upon the mask. Aiming at growing a long GaN single crystal ingot, Embodiment 3 uses the HVPE apparatus suitable for the long time operation like Embodiment 2.

(Formation of Epitaxy Layer)

A thick GaN epitaxy layer is grown for about 100 hours on the substrate in the HVPE apparatus on the conditions of maintaining the mask/GaN/sapphire substrate temperature at 1030° C., adjusting the $NH_3$ partial pressure at 0.35 atm (35 kPa) and controlling the HCl partial pressure at $4\times10^{-2}$ atm (4 kPa). The growth time is equal to Embodiment 2. The $NH_3$ partial pressure is slightly lower and the HCl partial pressure is slightly higher than Embodiment 2. The long time epitaxy makes an about 3 cm long GaN single crystal ingot. Thermal inner stress induced at cooling causes cracks in the sapphire substrate adhering to the bottom of the GaN ingot. The GaN ingot is free from crack. The top of the GaN ingot is a rough surface including many concavities and convexities of facets like Embodiment 2. The c-plane parts are about 30% of the top surface. The facet-regions occupy 70% of the top. The facet rate is F/W=0.7.

Hexagonal conical pits having {11$\bar{2}$2} facets appear on the rough GaN surface. The GaN ingot is sliced by a slicer into 24 GaN as-cut wafers. A top part of a 3 mm thickness and a bottom part of a 3 mm thickness near the sapphire are abandoned. The 24 as cut wafers are ground and polished into 24 flat, smooth mirror wafers of a 350 $\mu$m thickness.

Three sample wafers (K), (L) and (M) taken from different heights of the ingot are investigated. Sample K is the nearest one to the sapphire substrate. Sample L is taken from the middle portion. Sample M is the nearest to the top surface. The surface state and the EPD are examined by the electron microscope observation.

Sample K EPD: $2\times10^4$ $cm^{-2}$
Sample L EPD: $1\times10^4$ $cm^{-2}$
Sample M EPD: $8\times10^3$ $cm^{-2}$ Samples K, L and M of Embodiment 3 show sufficiently low EPD of an order of $10^4$ $cm^{-2}$ which is slightly higher than Embodiment 2. The EPD is the highest for Sample K (bottom) and the lowest for Sample M (top). The EPD seems to decrease as the growth progresses, which confirms the idea of reducing the dislocations by facet-growth. Embodiment 3 is nearly equivalent to Embodiment 1 in EPD. Embodiment 3 can make tens of GaN wafers at a stroke unlike Embodiment 1 which produces only one wafer in a process. The important matter of Embodiment 3 is the growing condition of the higher $NH_3$ partial pressure (0.35 atm (35 kPa)), the higher HCl partial pressure ($4\times10^{-2}$ atm (4 kPa)) and the higher temperature (1030° C.). The condition enables Embodiment 3 to maintain the facet-carrying growth.

The surfaces of the wafers are observed by an electron microscope. The etch pits are hexagonal conical concavities of a diameter of microns to tens of microns. The cathode luminescence examination teaches us that the centers of the etch pits coincide with the centers of the growing pits enclosed by the facets in the vertical direction in many cases. Almost all of the big etch pits, in particular, coincide with the centers of the growing pits. The fact is common with Embodiment 2.

Then, the wafer is cut into a thin film for observing the vertical dislocations by the TEM. Linear defect assembles extending in the vertical direction are observed at the centers of the etch pits which are also the centers of the growing pits. Planar defect assemblies are observed. Some of the planar defect assemblies extend in radial directions and meet with each other at a linear defect assembly at a crossing angle of 60 degrees. A plurality of dislocations exist in the vicinity of the centers of the pits. Few dislocations are observed at the regions distant from the pit centers within the scope of the TEM.

Such a low dislocation GaN is quite novel. There is a probability of producing long lifetime GaN type laser diodes made on the GaN substrate of Embodiment 3.

[Embodiment 4 (Sapphire Substrate; Four Step Epitaxy; Thick Ingot; Slicing Process)]

FIG. 20(a) to FIG. 20(c) show Embodiment 4 of the present invention. The substrate can be any one of the above-cited material. But here sapphire is adopted as the material of the substrate. FIG. 20(a) shows the section of a sapphire substrate 21 and a mask 22 with windows 23 deposited upon the substrate 21. FIG. 20(b) shows a thick (tall) GaN single crystal ingot 29 grown over the mask 22 on the condition for avoiding the mirror surface growth and maintaining the facet-growth. The surface is rough with many concavities and convexities. There are small mirror parts (s) on the surface. FIG. 20(c) shows a plurality of mirror wafers 30, 31, 32, 33 made by slicing the thick GaN ingot in the direction vertical to the growing axis, grinding and polishing the surfaces.

The details of the steps are explained. A sapphire substrate with a GaN layer and a mask having dotted windows is prepared in the similar manner to Embodiment 3. Since the mask/GaN/sapphire has the thin GaN layer, no GaN buffer layer is deposited upon the mask. A thick GaN crystal ingot is epitaxially grown on the masked substrate by four different steps in the HVPE apparatus like Embodiment 2 which is suitable for long time operation.

(Formation of GaN Epi-layer)

The first step (earliest 2 hours)

Growth temperature: 1030° C.

$NH_3$ partial pressure: 0.12 atm (12 kPa)

HCl partial pressure: $2 \times 10^{-2}$ atm (2 kPa)

The second step (next 2 hours)

Growth temperature: 1030° C.

$NH_3$ partial pressure: 0.35 atm (35 kPa)

HCl partial pressure: $2 \times 10^{-2}$ atm (2 kPa)

The third step (further 2 hours)

Growth temperature: 1030° C.

$NH_3$ partial pressure: 0.12 atm (12 kPa)

HCl partial pressure: $2 \times 10^{-2}$ atm (2 kPa)

The fourth step (the rest 95 hours)

Growth temperature: 1030° C.

$NH_3$ partial pressure: 0.35 atm (35 kPa)

HCl partial pressure: $4 \times 10^{-2}$ atm (4 kPa)

The sum of the growing time is 101 hours. The temperature of the substrate is kept at 1030° C. throughout all the four steps. The first step to the third step (6 hours) mainly change the $NH_3$ partial pressure. The condition of the 95 hours of the fourth step is the same as Embodiment 3.

The epitaxy growth makes an about 3 cm thick GaN single crystal ingot. The appearance of the ingot is similar to Embodiment 3. The top surface resembles the top of Embodiment 3. The GaN ingot is sliced into 24 as-cut wafers. A top part of a 3 mm thickness and a bottom part of a 3 mm thickness are abandoned. The 24 GaN as-cut wafers are ground and polished into 2-inch diameter mirror wafers of a 350 $\mu$m thickness.

The EPD is measured for three typical GaN wafers of Sample P (bottom side), Sample Q (middle part) and Sample R (top part) for estimating the GaN wafers of Embodiment 4.

Sample P EPD: $1 \times 10^4$ cm$^{-2}$

Sample Q EPD: $8 \times 10^3$ cm$^{-2}$

Sample R EPD: $6 \times 10^3$ cm$^{-2}$

The EPD decreases as the GaN growth progresses like Embodiments 2 and 3. The EPD is lower than Embodiment 3. The etch pits are hexagonal concavities of a diameter from 2 micrometers to tens of micrometers.

The etch pits of Embodiment 3 and Embodiment 4 are compared in detail. The cathode luminescence (CL) experiment teaches us that large pits are originated from linear defect assemblies extending vertically to the surface and tiny pits derive from usual penetration dislocations. There is a difference in the EPD of tiny pits between Embodiment 3 and Embodiment 4. The EPD of the small pits is lower in Embodiment 4 than Embodiment 3.

Measurement of the EPD of small etch pits

| EMBODIMENT 3 | | EMBODIMENT 4 | |
|---|---|---|---|
| Sample K | $1.5 \times 10^4$ cm$^{-2}$ | Sample P | $5 \times 10^3$ cm$^{-2}$ |
| Sample L | $6 \times 10^3$ cm$^{-2}$ | Sample Q | $4 \times 10^3$ cm$^{-2}$ |
| Sample M | $4 \times 10^3$ cm$^{-2}$ | Sample R | $2 \times 10^3$ cm$^{-2}$ |

The reason which causes the difference is investigated by cutting the abandoned part of the ingot near the bottom, revealing a section of the bottom side part and analyzing the cathode luminescence from the section. In Embodiment 4, the shapes and regions of the facet pits change far faster at an early stage of the growth than Embodiment 3. In Embodiment 4, the facet-carrying regions disperse wider in horizontal inner planes vertical to the growing axis at the early stage than Embodiment 3.

The dispersion of the facet-region on virtual (imaginary) horizontal planes is caused by the complex changes of the growing conditions in the early stages from the first step to the third step. Variation of the partial pressure of HCl or $NH_3$ and the temperature has a tendency of changing the distribution of the facet-regions on sequentially appearing virtual horizontal planes. Fluctuation of the distribution of the facet-regions give s all vertical virtual columns the facet-growth hysteresis. Expansion of the facet-growth hysteresis drastically decreases the dislocations in the GaN of Embodiment 4.

[Embodiment 5 (GaN Seed on GaAs; Ingot)]

Embodiment 5 chooses a GaAs wafer for a substrate. A 2-inch GaAs (111) is the substrate. (111) planes of GaAs has two versions. One (111) plane has Ga atoms covering all over the surface. The other (111) plane is covered with As atoms. Here, the first (111) covered with Ga atoms is used. Similarly to Embodiment 2, a 0.1 $\mu$m thick $SiO_2$ film is formed upon the GaAs wafer by the plasma CVD method as a mask. The $SiO_2$ film has a selective function of suppressing GaN from growing upon the film. Windows (apertures) are perforated on the $SiO_2$ mask by the photolithography.

Dots, stripes, lines and so on, arbitrary shapes are allowed for the shape of the windows. Stripe windows are selected here. A stripe window has a 3 $\mu$m width. The period of the turn of mask and window is 6 $\mu$m. The stripe windows align in parallel with each other. Each stripe extends in <11$\bar{2}$> direction of the GaAs substrate. The GaAs substrate is partially covered with the mask. The $SiO_2$ mask thickness is 100 nm. GaAs is exposed within the windows. GaN crystals are grown on the masked substrates by the HVPE apparatus which has been used in Embodiment 2.

(Formation of Buffer Layer)

Similarly to Embodiment 2, a GaN buffer layer of about 80 nm is grown on the masked substrate for 30 minutes on the condition of $NH_3$ partial pressure of 0.2 atm (20 kPa), HCl partial pressure of $2\times10^{-3}$ atm (2 kPa) and low temperature of about 500° C. Since the buffer layer (80 nm) is thinner than the mask (100 nm), the GaN buffer layer only piles on the substrate within the aperture of the mask. No GaN piles upon the mask. The mask has function of making GaN particles recoil.

(Formation of Epitaxy Layer)

Then, the GaAs substrate is heated up to 1000° C. A thick GaN epi-layer is further grown on the buffer/mask/GaAs substrate for about four hours on the condition of $NH_3$ partial pressure of 0.4 atm (40 kPa) and HCl partial pressure of $3\times10^{-2}$ atm (3 kPa).

The GaN/GaAs sample is etched by aqua regia. The GaAs substrate is eliminated. A freestanding GaN crystal is separated. The GaN crystal is treated with the grinding and polishing processes shown in FIG. 19. A GaN mirror wafer of a 0.4 mm thickness is obtained. The EPD is measured. The EPD is $2\times10^4$ cm$^{-2}$. The low EPD allows the GaN mirror wafer to be an independent substrate for making GaN devices.

(Epitaxy Growth from GaN Seed)

The GaN mirror wafer is utilized as a seed crystal for making a long GaN single crystal by epitaxial growth in vapor phase by the steps as shown in FIG. 21. The same HVPE apparatus as the former single epi-layer growth is used for making the long GaN ingot. The GaN is made in the HVPE apparatus on the condition of $NH_3$ partial pressure of 0.4 atm (40 kPa), HCl partial pressure of $3\times10^{-2}$ atm (3 kPa) and a temperature of 1000° C. About 1000 hour growth produces a GaN single crystal ingot of about a 2.6 cm height. No crack occurs. The state of the surface is far from the prior two-dimensional mirror surface but a facet-carrying rough surface having many concavities and convexities. The c-plane parts are only 5% of the total surface. 95% of the surface is occupied by the facet-carrying regions. Plenty of hexagonal pits having facets of $\{11\bar{2}2\}$ are observed on the rough surface.

The 2.6 cm long GaN ingot is sliced by a slicer into individual thin as-cut wafers. A top part of a 3 mm thickness and a bottom part of a 1 mm thickness are abandoned. The rugged top obliges the ingot to abandon the 3 mm thick part. Circular blade patterns are transcribed on the sliced as-cut wafers. Then, both surfaces of the wafers are polished. 25 GaN mirror wafers of a two inch diameter and a 350 µm thickness are obtained. The yield is the highest among the embodiments. No diffusion of arsenic from the GaAs substrate into the GaN crystal is found. Embodiment 5 is a suitable method for making good GaN crystals.

The GaN wafers are estimated. Three typical wafers are chosen. Sample S is taken from the bottom part near the substrate. Sample T is taken from the middle part. Sample U is cut from the top part. The EPD is measured for the samples by the method similar to Embodiment 1.

Sample S EPD: $7\times10^3$ cm$^{-2}$
Sample T EPD: $5\times10^3$ cm$^{-2}$
Sample U EPD: $3\times10^3$ cm$^{-2}$ These are the lowest EPD values among the embodiments. The etch pits are observed by an electron microscope. The etch pits are hexagonal concavities having a diameter from micrometers to tens of micrometers. The cathode luminescence examination shows that in many cases the etch pits exist at the centers of the growing pits consisting of the facets. Almost all of the large etch pits coincide with the centers of the growing pits.

Thin specimens are prepared by cutting the wafer. The vertical sections are examined by the TEM. Linear defect assemblies vertical to the substrate are observed at the centers of the etch pits which are the centers of the growing pits. Planar defect assemblies containing the linear defect assemblies are also found. In some cases, six planar defect assemblies meet each other at the linear defect assemblies at a 60° crossing angle. Dislocations are localized at the centers of the pits. Few dislocations are found at the other regions except the centers of the pits.

What is claimed is:

1. A method of growing a GaN single crystal comprising the steps of:

synthesizing GaN in vapor phase by supplying material gases including HCL gas and $NH_3$ gas;

piling a GaN crystal on a substrate at a high temperature;

producing a three-dimensional facet structure including facets and polygonal facet pits with boundaries made by the facets in the GaN crystal without making a flat surface;

maintaining the facet structure without burying the facet structure by decreasing temperature, enhancing HCl partial pressure, raising $NH_3$ partial pressure or heightening a growing speed;

sweeping dislocations existing in the facet pits to the boundaries of the pits by continuing the faceted growth in a vertical direction to the substrate;

accumulating the boundary assembled dislocations to bottom confluences of the pits by continuing the faceted growth;

making bundles of the dislocations below the pits; and reducing dislocations in the growing GaN crystal.

2. The method according to claim 1, wherein the three-dimensional facet structure is pits having facets or assemblies of pits having facets.

3. A method of growing a GaN single crystal comprising the steps of:

synthesizing GaN in vapor phase by supplying material gases including HCL gas and $NH_3$ gas;

piling a GaN crystal on a substrate at a high temperature;

producing a three-dimensional facet structure including facets and polygonal facet pits with boundaries made by the facets in the GaN crystal without making a flat surface;

maintaining the facet structure without burying the facet structure by decreasing temperature, enhancing HCl partial pressure, raising $NH_3$ partial pressure or heightening a growing speed;

producing planar defect assemblies extending in a direction which is vertical to an average growing surface;

sweeping dislocations existing in the facet pits to the boundaries of the pits by continuing the faceted growth in a vertical direction to the substrate;

accumulating the boundary assembled dislocations to bottom confluences of the pits by continuing the faceted growth;

making bundles of the dislocations below the pits; and reducing dislocations in the growing GaN crystal.

4. A method of growing a GaN single crystal comprising the steps of:

synthesizing GaN in vapor phase by supplying material gases including HCL gas and $NH_3$ gas;

piling a GaN crystal on a substrate at a high temperature;

producing a three-dimensional facet structure including facets and polygonal facet pits with boundaries made by the facets in the GaN crystal without making a flat surface;

maintaining the facet structure without burying the facet structure by decreasing temperature, enhancing HCl partial pressure, raising $NH_3$ partial pressure or heightening a growing speed;

producing linear defect assemblies extending in a direction which is vertical to an average growing surface;

sweeping dislocations existing in the facet pits to the boundaries of the pits by continuing the faceted growth in a vertical direction to the substrate;

accumulating the boundary assembled dislocations to bottom confluences of the pits by continuing the faceted growth;

making bundles of the dislocations below the pits; and reducing dislocations in the growing GaN crystal.

5. A method of growing a GaN single crystal comprising the steps of:

synthesizing GaN in vapor phase by supplying material gases including HCL gas and $NH_3$ gas;

piling a GaN crystal on a substrate at a high temperature;

producing a three-dimensional facet structure including facets and polygonal facet pits with boundaries made by the facets in the GaN crystal without making a flat surface;

maintaining the facet structure without burying the facet structure by decreasing temperature, enhancing HCl partial pressure, raising $NH_3$ partial pressure or heightening a growing speed;

producing linear defect assemblies extending in a direction which is vertical to an average growing surface in the pits having three dimensional facet structure;

sweeping dislocations existing in the facet pits to the boundaries of the pits by continuing the faceted growth in a vertical direction to the substrate;

accumulating the boundary assembled dislocations to bottom confluences of the pits by continuing the faceted growth;

making bundles of the dislocations below the pits; and reducing dislocations in the growing GaN crystal.

6. A method of growing a GaN single crystal comprising the steps of:

synthesizing GaN in vapor phase by supplying material gases including HCL gas and $NH_3$ gas;

piling a GaN crystal on a substrate at a high temperature;

producing a three-dimensional facet structure including facets and polygonal facet pits with boundaries made by the facets in the GaN crystal without making a flat surface;

maintaining the facet structure without burying the facet structure by decreasing temperature, enhancing HCl partial pressure, raising $NH_3$ partial pressure or heightening a growing speed;

producing planar defect assemblies extending in a direction which is vertical to an average growing surface in the pits having three-dimensional facet structure;

sweeping dislocations existing in the facet pits to the boundaries of the pits by continuing the faceted growth in a vertical direction to the substrate;

accumulating the boundary assembled dislocations to bottom confluences of the pits by continuing the faceted growth;

making bundles of the dislocations below the pits; and reducing dislocations in the growing GaN crystal.

7. A method of growing a GaN single crystal comprising the steps of:

synthesizing GaN in vapor phase by supplying material gases including HCL gas and $NH_3$ gas;

piling a GaN crystal on a substrate at a high temperature;

producing a three-dimensional facet structure including facets and polygonal facet pits with boundaries made by the facets in the GaN crystal without making a flat surface;

maintaining the facet structure without burying the facet structure by decreasing temperature, enhancing HCl partial pressure, raising $NH_3$ partial pressure or heightening a growing speed;

producing planar defect assemblies extending in horizontal radial directions and in a direction which is vertical to an average growing surface in the pits having three-dimensional facet structure;

sweeping dislocations existing in the facet pits to the boundaries of the pits by continuing the faceted growth in a vertical direction to the substrate;

accumulating the boundary assembled dislocations to bottom confluences of the pits by continuing the faceted growth;

making bundles of the dislocations below the pits; and reducing dislocations in the growing GaN crystal.

8. A method of growing a GaN single crystal comprising the steps of:

synthesizing GaN in vapor phase by supplying material gases including HCL gas and $NH_3$ gas;

piling a GaN crystal on a substrate at a high temperature;

producing a three-dimensional facet structure including facets and polygonal facet pits with boundaries made by the facets in the GaN crystal without making a flat surface;

maintaining the facet structure without burying the facet structure by decreasing temperature, enhancing HCl partial pressure, raising $NH_3$ partial pressure or heightening a growing speed;

giving facet-growth hysteresis to all regions at some height;

sweeping dislocations existing in the facet pits to the boundaries of the pits by continuing the faceted growth in a vertical direction to the substrate;

accumulating the boundary assembled dislocations to bottom confluences of the pits by continuing the faceted growth;

making bundles of the dislocations below the pits; and reducing dislocations in the growing GaN crystal.

9. The method according to claim 1, wherein the average growing surface is a c-plane (0001).

10. The method according to claim 3, wherein the planar defect assemblies extending vertically to the average growing surface are parallel with $\{11\bar{2}0\}$ planes or $\{1\bar{1}00\}$ planes.

11. The method according to claim 6, wherein the planar defect assemblies extending vertically to the average growing surface are parallel with $\{11\bar{2}0\}$ planes or $\{1\bar{1}00\}$ planes.

12. The method according to claim 7, wherein the planar defect assemblies extending vertically to the average growing surface are parallel with $\{11\bar{2}0\}$ planes or $\{1\bar{1}00\}$ planes.

13. The method according to claim 3, wherein the planar defect assemblies extending vertically to the average growing surface are small angle grain boundaries.

14. The method according to claim 6, wherein the planar defect assemblies extending vertically to the average growing surface are small angle grain boundaries.

15. The method according to claim 7, wherein the planar defect assemblies extending vertically to the average growing surface are small angle grain boundaries.

16. The method according to claim 2, wherein the pits with three-dimensional facets or the assemblies of pits having facets have diameters from 10 $\mu$ms to 2000 m $\mu$m.

17. The method according to claim 5, wherein the pits with three-dimensional facets or the assemblies of pits having facets have diameters from 10 $\mu$ms to 2000 m $\mu$m.

18. The method according to claim 6, wherein the pits with three-dimensional facets or the assemblies of pits having facets have diameters from 10 $\mu$ms to 2000 m $\mu$m.

19. The method according to claim 7, wherein the pits with three-dimensional facets or the assemblies of pits having facets have diameters from 10 $\mu$ms to 2000 m $\mu$m.

20. A method of making a GaN single crystal substrate comprising the steps of:

preparing a substrate;

synthesizing GaN in vapor phase by supplying material gases including HCL gas and $NH_3$ gas;

piling a GaN crystal on a substrate at a high temperature;

producing a three-dimensional facet structure including facets and polygonal facet pits with boundaries made by the facets in the GaN crystal without making a flat surface;

maintaining the facet structure without burying the facet structure by decreasing temperature, enhancing HCl partial pressure, raising $NH_3$ partial pressure or heightening a growing speed;

sweeping dislocations existing in the facet pits to the boundaries of the pits by continuing the faceted growth in a vertical direction to the substrate;

accumulating the boundary assembled dislocations to bottom confluences of the pits by continuing the faceted growth;

making bundles of the dislocations below the pits;

reducing dislocations in the growing GaN crystal;

giving the grown GaN crystal a flat surface by mechanical processing; and giving a the GaN crystal a smooth mirror surface by polishing.

21. The method according to claim 20, wherein the mechanical processing is slicing, which cuts an ingot into a plurality of wafers.

22. The method according to claim 20, wherein the mechanical processing is grinding.

23. The method according to claim 20, wherein a facet rate F/W of three-dimensional facet structure area F having pits and assemblies of pits to the total surface W is more than 10% both for the GaN crystal growing in vapor phase and for the grown GaN crystal.

24. The method according to claim 20, wherein a facet rate F/W of three-dimensional facet structure area F having pits and assemblies of pits to the total surface W is more than 40% both for the GaN crystal growing in vapor phase and for the grown GaN crystal.

25. The method according to claim 20, wherein a facet rate F/W of three-dimensional facet structure area F having pits and assemblies of pits to the total surface W is more than 80% both for the GaN crystal growing in vapor phase and for the grown GaN crystal and the pits and the assemblies of pits are linked with each other.

26. The method according to claim 20, wherein a facet rate F/W of three-dimensional facet structure area F having pits and assemblies of pits to the total surface W is 100% both for the GaN crystal growing in vapor phase and for the grown GaN crystal, the surface of the crystal has no flat parts vertical to the growing direction and all the pits and the assemblies of pits are linked with each other.

27. The method according to claim 20, wherein the pits and the assemblies of pits include curves deviating from the facets.

28. The method according to claim 25, wherein a rate of areas of growing pits and the assemblies of growing pits to the total surface is more than 80% for the grown GaN crystal and all the pits and the assemblies of pits are constructed by curves deviating from the facets.

29. The method according to claim 20, wherein dislocations are accumulated into linear defect assemblies having density of less than $10^5$ cm$^{-2}$ and expanding vertical to an average growing plane.

30. The method according to claim 20, wherein EPD (etch pit density) is less than $10^6$ cm$^{-2}$.

31. The method according to claim 20, wherein the GaN crystal is grown in vapor phase on the substrate which is a single crystal of sapphire ($Al_2O_3$), silicon carbide (SiC), silicon (Si), spinel ($MgAl_2O_4$), neodymium gallium oxide ($NdGaO_3$), zinc oxide (ZnO), magnesium oxide (MgO), silicon dioxide ($SiO_2$), gallium arsenide (GaAs), gallium phosphide (GaP), gallium nitride (GaN) or aluminum nitride (AlN).

32. The method according to claim 20, wherein the GaN crystal is grown to a thickness sufficient for taking a plurality of wafers in vapor phase on the substrate which is a single crystal of sapphire ($Al_2O_3$), silicon carbide (SiC), silicon (Si), spinel ($MgAl_2O_4$), neodymium gallium oxide ($NdGaO_3$), zinc oxide (ZnO), magnesium oxide (MgO), silicon dioxide ($SiO_2$), gallium arsenide (GaAs), gallium phosphide (GaP), gallium nitride (GaN) or aluminum nitride (AlN) and the thick GaN single crystal is sliced into a plurality of wafers.

33. The method according to claim 20, wherein the GaN crystal is grown in vapor phase on the substrate which consists of a single crystal of sapphire ($Al_2O_3$), silicon carbide (SiC), silicon (Si), spinel ($MgAl_2O_4$), neodymium gallium oxide ($NdGaO_3$), zinc oxide (ZnO), magnesium oxide (MgO), silicon dioxide ($SiO_2$), gallium arsenide (GaAs), gallium phosphide (GaP), gallium nitride (GaN) or aluminum nitride (AlN) and an amorphous or polycrystalline mask with windows covering the single crystal.

34. The method according to claim 20, wherein the GaN crystal is grown to a thickness sufficient for taking a plurality of wafers in vapor phase on the substrate which consists of a single crystal of sapphire ($Al_2O_3$), silicon carbide (SiC), silicon (Si), spinel ($MgAl_2O_4$), neodymium gallium oxide ($NdGaO_3$), zinc oxide (ZnO), magnesium oxide (MgO), silicon dioxide ($SiO_2$), gallium arsenide (GaAs), gallium phosphide (GaP), gallium nitride (GaN) or aluminum nitride (AlN) and an amorphous or polycrystalline mask with windows covering the single crystal, and the thick GaN single crystal is sliced into a plurality of wafers.

35. The method according to claim 20, wherein the GaN crystal is grown in vapor phase on the substrate which is a single crystal of sapphire ($Al_2O_3$), silicon carbide (SiC), silicon (Si), spinel ($MgAl_2O_4$), neodymium gallium oxide ($NdGaO_3$), zinc oxide (ZnO), magnesium oxide (MgO), silicon dioxide ($SiO_2$), gallium arsenide (GaAs), gallium phosphide (GaP), gallium nitride (GaN) or aluminum nitride (AlN) and the single crystal substrate is eliminated from the grown GaN single crystal.

36. The method according to claim 20, wherein the GaN crystal is grown in vapor phase on the substrate which consists of a single crystal of sapphire (Al$_2$O$_3$), silicon carbide (SiC), silicon (Si), spinel (MgAl$_2$O$_4$), neodymium gallium oxide (NdGaO$_3$), zinc oxide (ZnO), magnesium oxide (MgO), silicon dioxide (SiO$_2$), gallium arsenide (GaAs), gallium phosphide (GaP), gallium nitride (GaN) or aluminum nitride (AlN) and an amorphous or polycrystalline mask with windows covering the single crystal, and the single crystal substrate is eliminated from the grown GaN single crystal.

37. A method of making a GaN single crystal substrate comprising the steps of:
   preparing a GaAs (111) single crystal substrate;
   coating the substrate with a mask with windows;
   synthesizing GaN in vapor phase by supplying material gases including HCL gas and NH$_3$ gas;
   piling a GaN crystal on a substrate at a high temperature;
   producing a three-dimensional facet structure including pits with facets and assemblies of pits with facets in the GaN crystal without making a flat surface;
   maintaining the facet structure without burying the facet structure by decreasing temperature, enhancing HCl partial pressure, raising NH$_3$ partial pressure or heightening a growing speed;
   sweeping dislocations existing in the facet pits to the boundaries of the pits by continuing the faceted growth in a vertical direction to the substrate;
   accumulating the boundary assembled dislocations to bottom confluences of the pits by continuing the faceted growth;
   making bundles of the dislocations below the pits;
   reducing dislocations in the growing GaN crystal;
   eliminating the GaAs substrate from the grown GaN crystal;
   giving the grown GaN crystal a flat surface by mechanical processing; and
   giving the GaN crystal a smooth mirror surface by polishing.

38. A method of making a GaN single crystal substrate comprising the steps of:
   preparing a GaN single crystal substrate as a seed;
   synthesizing GaN in vapor phase by supplying material gases including HCL gas and NH$_3$ gas;
   piling a GaN crystal on a substrate at a high temperature;
   producing a three-dimensional facet structure including pits with facets and assemblies of pits with facets in the GaN crystal without making a flat surface;
   maintaining the facet structure without burying the facet structure by decreasing temperature, enhancing HCl partial pressure, raising NH$_3$ partial pressure or heightening a growing speed;
   sweeping dislocations existing in the facet pits to the boundaries of the pits by continuing the faceted growth in a vertical direction to the substrate;
   accumulating the boundary assembled dislocations to bottom confluences of the pits by continuing the faceted growth;
   making bundles of the dislocations below the pits;
   reducing dislocations in the growing GaN crystal;
   growing the GaN crystal to a thickness of a plurality of wafers;
   slicing the GaN crystal into a plurality of GaN wafers;
   giving the GaN wafers flat surfaces by mechanical processing; and
   giving the GaN wafers smooth mirror surfaces by polishing.

39. A GaN single crystal substrate produced by steps of:
   preparing a substrate,
   synthesizing GaN in vapor phase by supplying material gases including HCL gas and NH$_3$ gas,
   piling a GaN crystal on a substrate at a high temperature,
   producing a three-dimensional facet structure including pits with facets and assemblies of pits with facets in the GaN crystal without making a flat surface,
   maintaining the facet structure without burying the facet structure by decreasing temperature, enhancing HCl partial pressure, raising NH$_3$ partial pressure or heightening a growing speed,
   sweeping dislocations existing in the facet pits to the boundaries of the pits by continuing the faceted growth in a vertical direction to the substrate,
   accumulating the boundary assembled dislocations to bottom confluences of the pits by continuing the faceted growth,
   making bundles of the dislocations below the pits,
   reducing dislocations in the growing GaN crystal, giving the GaN crystal flat surfaces by mechanical processing, and
   giving the GaN wafers smooth mirror surfaces by polishing.

40. The GaN single crystal substrate according to claim 39, wherein a facet rate F/W of three dimensional facet structure area F having pits and assemblies of pits to the total surface W is more than 10% both for the GaN crystal growing in vapor phase and for the grown GaN crystal.

41. The GaN single crystal substrate according to claim 39, wherein a facet rate F/W of three dimensional facet structure area F having pits and assemblies of pits to the total surface W is more than 40% both for the GaN crystal growing in vapor phase and for the grown GaN crystal.

42. The GaN single crystal substrate according to claim 39, wherein a facet rate F/W of three dimensional facet structure area F having pits and assemblies of pits to the total surface W is more than 80% both for the GaN crystal growing in vapor phase and for the grown GaN crystal and the pits and the assemblies of pits are linked with each other.

43. The GaN single crystal substrate according to claim 39, wherein a facet rate F/W of three dimensional facet structure area F having pits and assemblies of pits to the total surface W is 100% both for the GaN crystal growing in vapor phase and for the grown GaN crystal, the surface of the crystal has no flat parts vertical to the growing direction and all the pits and the assemblies of pits are linked with each other.

44. The GaN single crystal substrate according to claim 39, wherein the pits and the assemblies of pits include curves deviating from the facets.

45. The GaN single crystal substrate according to claim 42, wherein a rate of areas of growing pits and the assemblies of growing pits to the total surface is more than 80% for the grown GaN crystal and all the pits and the assemblies of pits are constructed by curves deviating from the facets.

46. The GaN single crystal substrate according to claim 39, wherein dislocations are accumulated into linear defect assemblies having density of less than $10^5$ cm$^{-2}$ and expanding vertical to an average growing plane.

47. The GaN single crystal substrate according to claim 39, wherein EPD (etch pit density) is less than $10^6$ cm$^{-2}$.

48. The GaN single crystal substrate according to claim 39, wherein the pits with three-dimensional facets or the assemblies of pits having facets have diameters from 10 μms to 2000 m μm.

49. The GaN single crystal substrate according to claim 39, wherein the GaN crystal is grown in vapor phase on the substrate which is a single crystal of sapphire ($Al_2O_3$), silicon carbide (SiC), silicon (Si), spinel ($MgAl_2O_4$), neodymium gallium oxide ($NdGaO_3$), zinc oxide (ZnO), magnesium oxide (MgO), silicon dioxide ($SiO_2$), gallium arsenide (GaAs), gallium phosphide (GaP), gallium nitride (GaN) or aluminum nitride (AlN) and the single crystal substrate is eliminated from the grown GaN single crystal.

50. The GaN single crystal substrate according to claim 39, wherein the GaN crystal is grown in vapor phase on the substrate which consists of a single crystal of sapphire ($Al_2O_3$), silicon carbide (SiC), silicon (Si), spine ($MgAl_2O_4$), neodymium gallium oxide ($NdGaO_3$), zinc oxide (ZnO), magnesium oxide (MgO), silicon dioxide ($SiO_2$), gallium arsenide (GaAs), gallium phosphide (GaP), gallium nitride (GaN) or aluminum nitride (AlN) and an amorphous or polycrystalline mask with windows covering the single crystal, and the single crystal substrate is eliminated from the grown GaN single crystal.

51. A method of growing a GaN single crystal comprising the steps of:

synthesizing GaN in vapor phase;

piling a GaN crystal on a substrate;

producing a three-dimensional facet structure including facets in the GaN crystal without making a flat surface;

maintaining the facet structure throughout GaN crystal growing without burying the facet structure; and reducing dislocations in the growing GaN crystal.

\* \* \* \* \*